(12) United States Patent
Santhanam et al.

(10) Patent No.: US 12,034,458 B1
(45) Date of Patent: Jul. 9, 2024

(54) THROUGHPUT EFFICIENT REED-SOLOMON FORWARD ERROR CORRECTION DECODING

(71) Applicant: Synopsys, Inc., Sunnyvale, CA (US)

(72) Inventors: Venugopal Santhanam, Karnataka (IN); Aman Mishra, Karnataka (IN)

(73) Assignee: SYNOPSYS, INC., Sunnyvale, CA (US)

( * ) Notice: Subject to any disclaimer, the term of this patent is extended or adjusted under 35 U.S.C. 154(b) by 0 days.

(21) Appl. No.: 18/224,403

(22) Filed: Jul. 20, 2023

Related U.S. Application Data

(62) Division of application No. 17/809,715, filed on Jun. 29, 2022, now Pat. No. 11,750,222.

(51) Int. Cl.
*H03M 13/00* (2006.01)
*H03M 13/15* (2006.01)

(52) U.S. Cl.
CPC ... *H03M 13/1515* (2013.01); *H03M 13/1575* (2013.01); *H03M 13/6516* (2013.01)

(58) Field of Classification Search
CPC ......... H03M 13/1515; H03M 13/1545; H03M 13/154; H03M 13/15; H03M 13/1575
See application file for complete search history.

(56) References Cited

U.S. PATENT DOCUMENTS

| | | | |
|---|---|---|---|
| 6,415,413 B1* | 7/2002 | Pan | H03M 13/1515 714/784 |
| 6,539,515 B1* | 3/2003 | Gong | H03M 13/1515 714/784 |
| 6,571,368 B1 | 5/2003 | Chen | |
| 6,694,476 B1 | 2/2004 | Sridharan et al. | |
| 7,020,826 B2* | 3/2006 | Litwin, Jr. | H03M 13/1515 |
| 7,757,156 B2* | 7/2010 | Jung | H03M 13/1535 714/784 |
| 7,793,195 B1 | 9/2010 | Wu | |
| 7,805,662 B2* | 9/2010 | Ma | H03M 13/1515 714/756 |
| 7,900,122 B2 | 3/2011 | Shen et al. | |
| 8,397,143 B2 | 3/2013 | Neznanov et al. | |
| 8,671,325 B1* | 3/2014 | Feng | H03M 13/6502 714/755 |
| 10,763,895 B2 | 9/2020 | Santhanam et al. | |

(Continued)

*Primary Examiner* — Esaw T Abraham
(74) *Attorney, Agent, or Firm* — Lewis Roca Rothgerber Christie LLP

(57) ABSTRACT

A Reed-Solomon decoder circuit includes: a syndrome calculator circuit to compute syndrome values for a first codeword and a second codeword sequentially supplied to the syndrome calculator circuit, where last symbols of the first codeword overlap with first symbols of the second codeword during an overlap clock cycle between: a first plurality of non-overlap clock cycles during which the first codeword is supplied to the syndrome calculator circuit; and a second plurality of non-overlap clock cycles during which the second codeword is supplied to the syndrome calculator circuit; an error locator and error evaluator polynomial calculator circuit; an error location and error value calculator circuit; an error counter; and an error corrector circuit to correct the errors in the first codeword and the second codeword based on error counts and the error magnitudes computed by an error evaluator circuit.

20 Claims, 14 Drawing Sheets

(56) References Cited

U.S. PATENT DOCUMENTS

| | | | |
|---|---|---|---|
| 10,879,933 B2 * | 12/2020 | Kim | H03M 13/154 |
| 11,146,293 B2 | 10/2021 | Stanisavljevic et al. | |
| 2003/0229841 A1 | 12/2003 | Kravchenko | |
| 2010/0031127 A1 * | 2/2010 | Panteleev | H03M 13/154 |
| | | | 714/784 |
| 2010/0281344 A1 * | 11/2010 | Gasanov | H03M 13/1515 |
| | | | 714/784 |
| 2022/0013187 A1 | 1/2022 | Santhanam | |

* cited by examiner

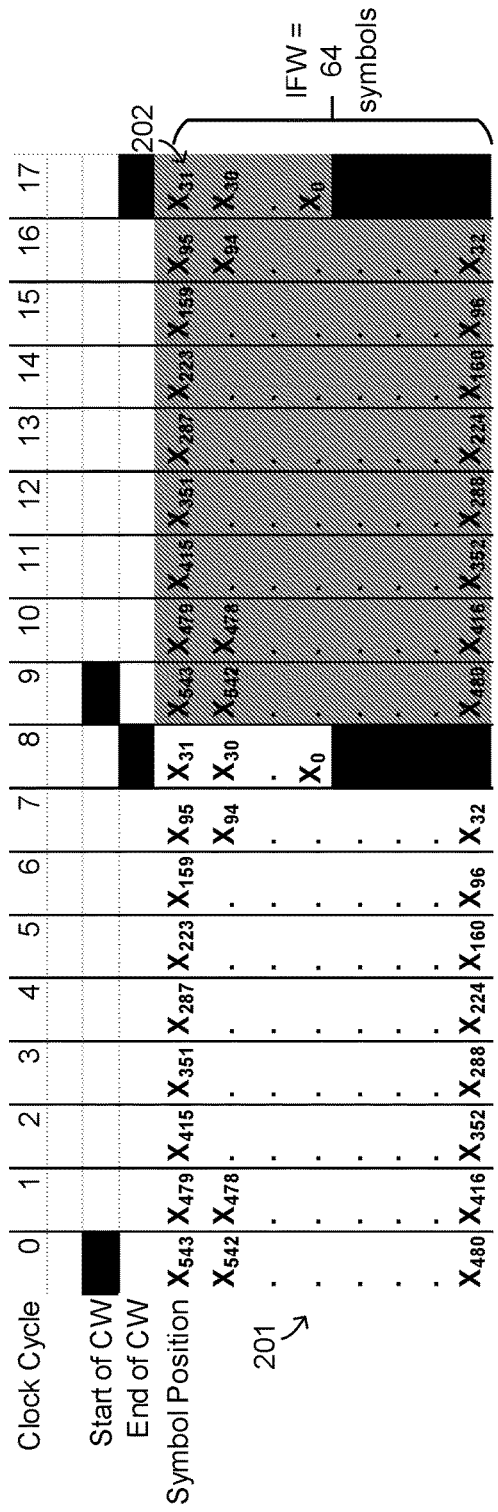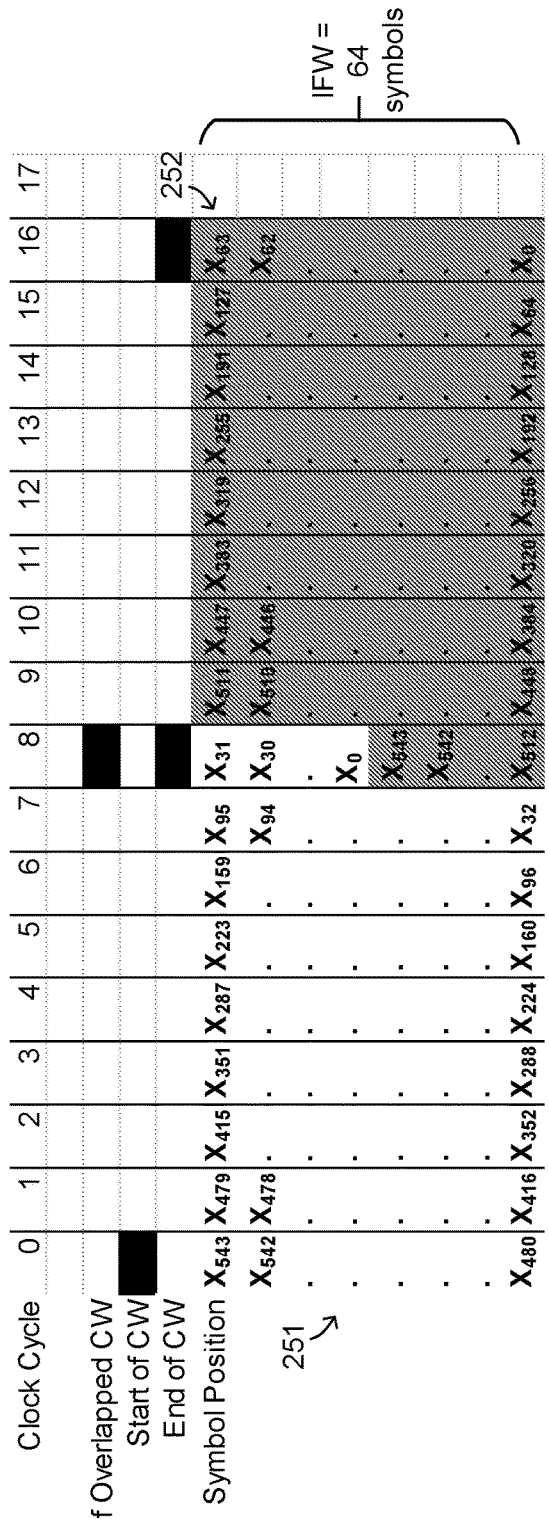

| Clock Cycle | 0 | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|---|
| $a^{-j}$ for chfr slice 0 | $a^{-543}$ $a^{-512}$ | $a^{-479}$ $a^{-448}$ | $a^{-415}$ $a^{-384}$ | $a^{-351}$ $a^{-320}$ | $a^{-287}$ $a^{-256}$ | $a^{-223}$ $a^{-192}$ | $a^{-159}$ $a^{-128}$ | $a^{-95}$ $a^{-64}$ | $a^{-31}$ $a^{0}$ | $a^{-511}$ $a^{-480}$ | $a^{-447}$ $a^{-416}$ | $a^{-383}$ $a^{-352}$ | $a^{-319}$ $a^{-288}$ | $a^{-255}$ $a^{-224}$ | $a^{-191}$ $a^{-160}$ | $a^{-127}$ $a^{-96}$ | $a^{-63}$ $a^{-32}$ |
| $a^{-j}$ for chfr slice 1 | $a^{-511}$ $a^{-480}$ | $a^{-447}$ $a^{-416}$ | $a^{-383}$ $a^{-352}$ | $a^{-319}$ $a^{-288}$ | $a^{-255}$ $a^{-224}$ | $a^{-191}$ $a^{-160}$ | $a^{-127}$ $a^{-96}$ | $a^{-63}$ $a^{-32}$ | $a^{-543}$ $a^{-512}$ | $a^{-479}$ $a^{-448}$ | $a^{-415}$ $a^{-384}$ | $a^{-351}$ $a^{-320}$ | $a^{-287}$ $a^{-256}$ | $a^{-223}$ $a^{-192}$ | $a^{-159}$ $a^{-128}$ | $a^{-95}$ $a^{-64}$ | $a^{-31}$ $a^{0}$ |

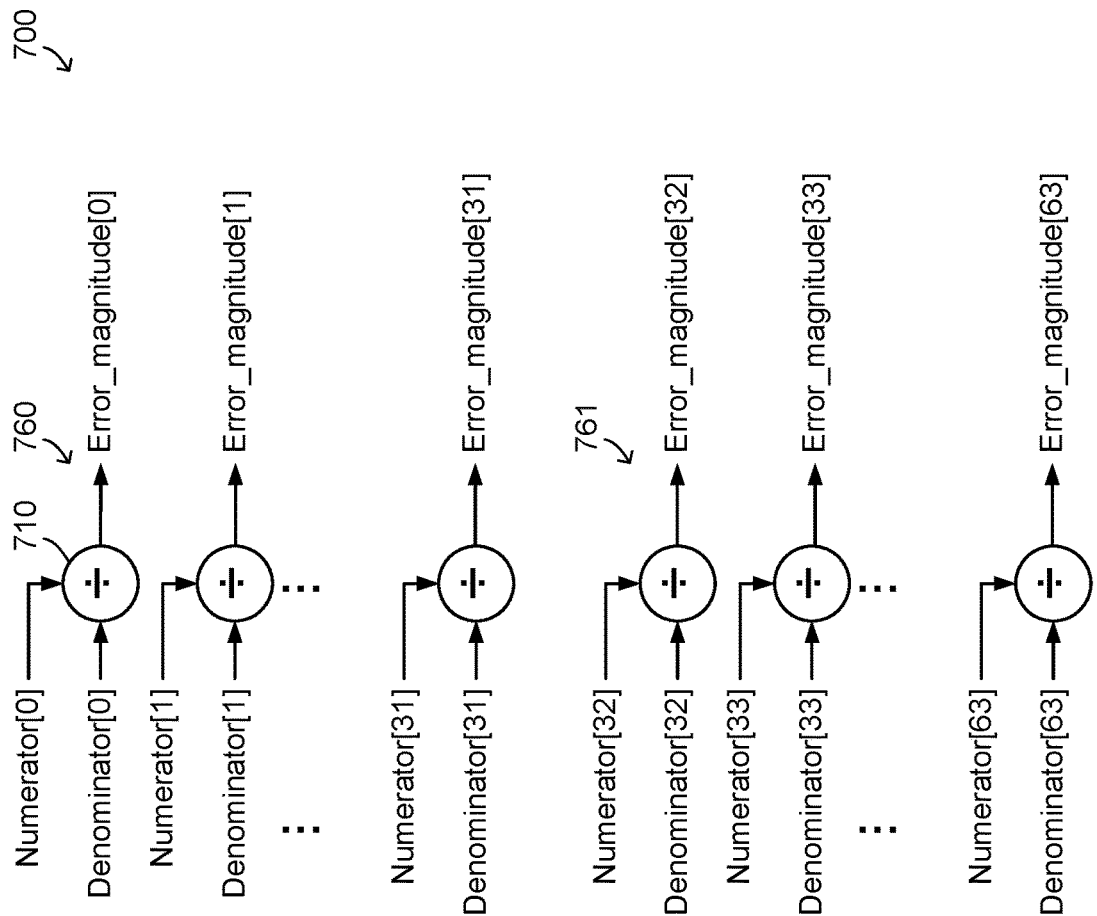

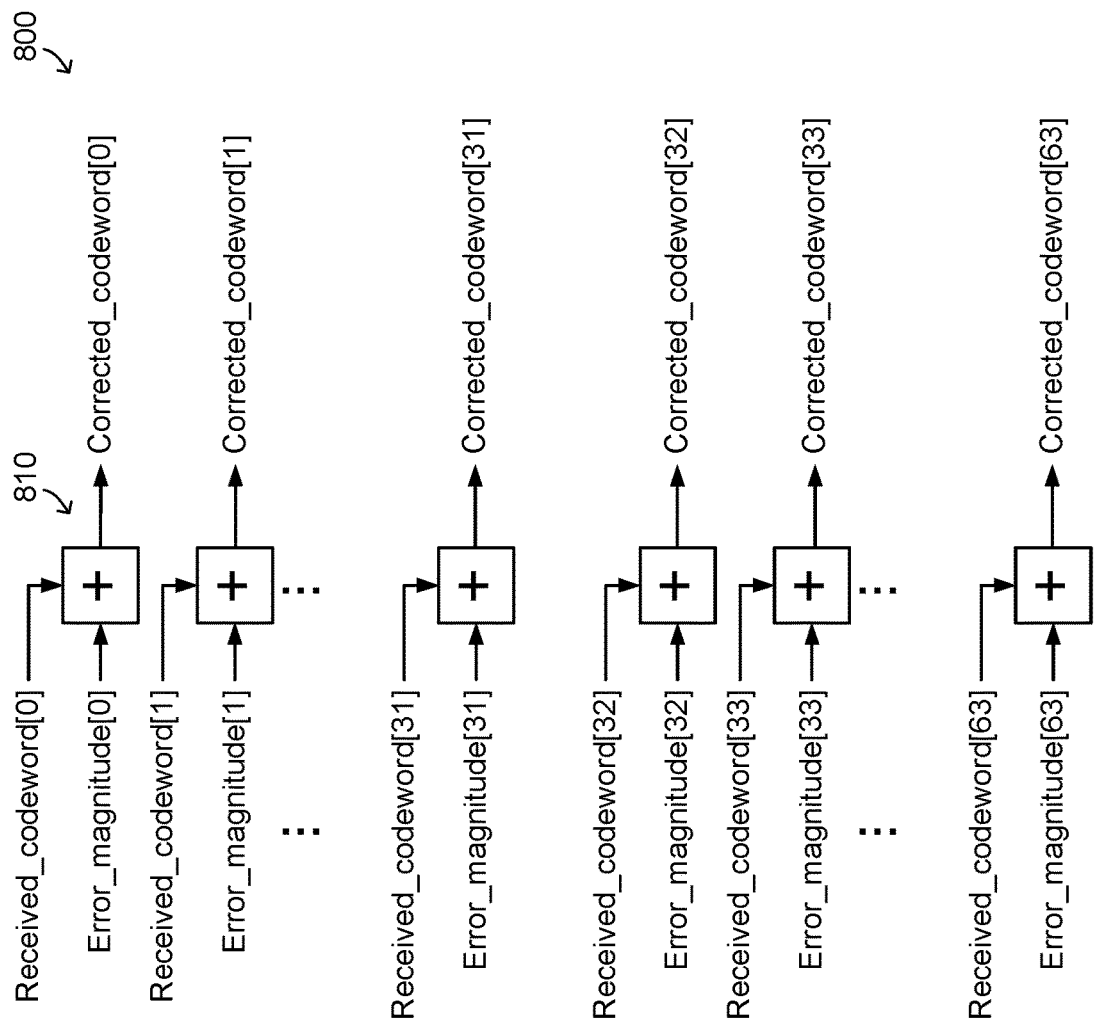

THROUGHPUT EFFICIENT REED-SOLOMON FORWARD ERROR CORRECTION DECODING

CROSS-REFERENCE TO RELATED APPLICATION(S)

The present application is a divisional of U.S. patent application Ser. No. 17/809,715, filed Jun. 29, 2022, (now U.S. Pat. No. 11,750,222, issued Sep. 5, 2023), the entire contents of which are incorporated herein by reference.

TECHNICAL FIELD

The present disclosure relates to an electronic communication system. In particular, the present disclosure relates to an architecture of a Reed-Solomon (RS) forward error correction (FEC) decoder.

BACKGROUND

High speed data communications are susceptible to noise, which results in corruption of the data during transmission. Forward error correction (FEC) schemes have been developed to enable receiving devices to detect and correct errors in the data they receive. A FEC scheme is a method of controlling errors in data transmission by transmitting additional data (e.g., parity data) by a source or transmitter. The parity data allows the destination or receiving device to detect a number of errors in the received data and correct a number of errors without requesting that the transmitting device re-transmit the data that was corrupted during a previous transmission.

SUMMARY

According to one embodiment of the present disclosure, a Reed-Solomon decoder circuit includes: a syndrome calculator circuit configured to compute syndrome values for a first codeword and a second codeword sequentially supplied to the syndrome calculator circuit, where last symbols of the first codeword overlap with first symbols of the second codeword during an overlap clock cycle between: a first plurality of non-overlap clock cycles during which the first codeword is supplied to the syndrome calculator circuit; and a second plurality of non-overlap clock cycles during which the second codeword is supplied to the syndrome calculator circuit; an error locator and error evaluator polynomial calculator circuit configured to compute error locator polynomials and error evaluator polynomials based on the syndrome values; an error location and error value calculator circuit configured to compute error locations based on the error locator polynomials and Forney numerator and denominator values based on the error evaluator polynomials; an error counter and error evaluator circuit configured to count errors based on the error locations and compute error magnitudes based on the Forney numerator and denominator values; and an error corrector circuit configured to correct the errors in the first codeword and the second codeword based on the error counts and the error magnitudes.

The syndrome calculator circuit may include: an input interface having an interface width; a first circuit slice configured to compute first syndrome values based on input symbols received from a first portion of the input interface, the first circuit slice may include a first internal syndrome register storing a first accumulated syndrome value; a second circuit slice configured to compute second syndrome values based on input symbols received from a second portion of the input interface in parallel with the first circuit slice, the second circuit slice may include: a second internal syndrome register storing a second accumulated syndrome value; and a third internal syndrome register storing a scaled second accumulated syndrome value; and an output multiplexer configured to selectively output: a sum of the first accumulated syndrome value stored in the first internal syndrome register and the scaled second accumulated syndrome value stored in the third internal syndrome register, during a clock cycle immediately following the overlap clock cycle; and a sum of the first accumulated syndrome value stored in the first internal syndrome register and the second accumulated syndrome value stored in the second internal syndrome register during a clock cycle other than the clock cycle immediately following the overlap clock cycle.

The error locator and error evaluator polynomial calculator circuit may include: a plurality of Reformulated Inversion-less Berlekamp Massey (RiBM) instances; a demultiplexer connected to a plurality of inputs of corresponding ones of the RiBM instances; and a multiplexer connected to a plurality of outputs of corresponding ones of the RiBM instances.

The error location and error value calculator circuit may include: a first circuit slice and a second circuit slice configured to compute error locations based on an input error locator polynomial; a register configured to store the input error locator polynomial; and a multiplexer connected to an output of the register and configured to delay supplying the input error locator polynomial to the first circuit slice when the input error locator polynomial corresponds to the second codeword where the first symbols of the second codeword were supplied to the Reed-Solomon decoder circuit during the overlap clock cycle.

The error location and error value calculator circuit may include: a first circuit slice and a second circuit slice configured to compute Forney numerator and denominator values based on an input error evaluator polynomial; a register configured to store the input error evaluator polynomial; and a multiplexer connected to an output of the register and configured to delay supplying the input error evaluator polynomial to the first circuit slice when the input error evaluator polynomial corresponds to the second codeword where the first symbols of the second codeword were supplied to the Reed-Solomon decoder circuit during the overlap clock cycle.

The error counter and error evaluator circuit may include: an input interface having an interface width; a first circuit slice configured to compute a first error count based on error locations received from a first portion of the input interface, the first circuit slice may include a first error count register storing a first accumulated count of errors; a second circuit slice configured to compute a second error count based on error locations received from a second portion of the input interface in parallel with the first circuit slice, the second circuit slice may include: a second error count register storing a second accumulated count of errors; and a third error count register storing the second accumulated count of errors; and an output multiplexer configured to selectively output: a sum of the first accumulated count of errors stored in the first error count register and the second accumulated count of errors stored in the third error count register, during a clock cycle immediately following the overlap clock cycle; and a sum of the first accumulated count of errors stored in the first error count register and the second accumulated count of errors stored in the second error count register during a clock cycle other than the clock cycle immediately following the overlap clock cycle.

The Reed-Solomon decoder circuit may be a component of a network interface device.

The first codeword and the second codeword may be encoded in RS(544,514), and an interface width of the Reed-Solomon decoder circuit may be 64 symbols.

According to one example of the present disclosure, a method includes: receiving a first portion of a first codeword during a plurality of first non-overlap clock cycles; receiving, by a Reed-Solomon decoder circuit, a second portion of the first codeword and a first portion of a second codeword during an overlap clock cycle between the first plurality of non-overlap clock cycles and a second plurality of non-overlap clock cycles; receiving a second portion of the second codeword over the second plurality of non-overlap clock cycles; and computing, by the Reed-Solomon decoder circuit, a first decoded message and a second decoded message from the first codeword and the second codeword, the first decoded message and the second decoded message being output during a period having a length equal to a sum of the first plurality of non-overlap clock cycles, the overlap clock cycle, and the second plurality of non-overlap clock cycles.

The Reed-Solomon decoder circuit may include a syndrome calculator may include a first circuit slice and a second circuit slice, where the first circuit slice may include a first internal syndrome register configured to store a first accumulated syndrome value computed by the first circuit slice during the first plurality of non-overlap clock cycles based on the first portion of the first codeword, where the second circuit slice may include: a second internal syndrome register configured to store a second accumulated syndrome value computed by the second circuit slice during the first plurality of non-overlap clock cycles based on the first portion of the first codeword; and a third internal syndrome register configured to store a scaled second accumulated syndrome value during the overlap clock cycle. where the method further may include computing a syndrome value corresponding to the first codeword during a clock cycle following the overlap clock cycle based on a Galois Field sum of the first accumulated syndrome value stored in the first internal syndrome register and the scaled second accumulated syndrome value stored in the third internal syndrome register.

The Reed-Solomon decoder circuit may include an error locator and error evaluator polynomial calculator which may include: a plurality of Reformulated Inversion-less Berlekamp Massey (RiBM) instances; a demultiplexer connected to a plurality of inputs of corresponding ones of the RiBM instances; and a multiplexer connected to a plurality of outputs of corresponding ones of the RiBM instances, and where the method further may include: routing, by the demultiplexer, a first syndrome value corresponding to the first codeword to a first RiBM instance of the RiBM instances; routing, by the demultiplexer, a second syndrome value corresponding to the second codeword to a second RiBM instance of the RiBM instances; routing, by the multiplexer, a first error locator polynomial and a first error evaluator polynomial corresponding to the first codeword from the first RiBM instance to an output of the error locator and error evaluator polynomial calculator; and routing, by the multiplexer, a second error locator polynomial and a second error evaluator polynomial corresponding to the second codeword from the second RiBM instance to the output of the error locator and error evaluator polynomial calculator.

The Reed-Solomon decoder circuit may include an error location and error value calculator circuit which may include: a first circuit slice and a second circuit slice configured to compute error locations based on an input error locator polynomial, where the method may include: delaying supplying the input error locator polynomial to the first circuit slice when the input error locator polynomial corresponds to the second codeword where first symbols of the second codeword were supplied to the Reed-Solomon decoder circuit during the overlap clock cycle.

The Reed-Solomon decoder circuit may include an error location and error value calculator circuit which may include: a first circuit slice and a second circuit slice configured to compute Forney numerator and denominator values based on an input error evaluator polynomial, where the method may include: delaying supplying the input error evaluator polynomial to the first circuit slice when the input error evaluator polynomial corresponds to the second codeword where first symbols of the second codeword were supplied to the Reed-Solomon decoder circuit during the overlap clock cycle.

The Reed-Solomon decoder circuit may include an error counter and error evaluator circuit which may include a first circuit slice and a second circuit slice, where the first circuit slice may include a first error count register configured to store a first accumulated count of errors computed by the first circuit slice during the first plurality of non-overlap clock cycles based on the first portion of the first codeword, where the second circuit slice may include: a second error count register configured to store a second accumulated count of errors computed by the second circuit slice during the first plurality of non-overlap clock cycles based on the first portion of the first codeword; and a third error count register configured to store the second accumulated count of errors during the overlap clock cycle. where the method further may include computing a total error count corresponding to the first codeword during a clock cycle following the overlap clock cycle based on a sum of the first accumulated count of errors stored in the first error count register and the second accumulated count of errors stored in the third error count register. Implementations of the described techniques may include hardware, a method or process, or computer software on a computer-accessible medium.

According to one example of the present disclosure, a non-transitory computer-readable medium includes a stored description of a Reed-Solomon decoder circuit, which when compiled by a processor to generate a lower level description, which wen supplied to a fabrication system, causes the fabrication system to fabricate a Reed-Solomon decoder circuit may include: a syndrome calculator circuit configured to compute syndrome values for a first codeword and a second codeword sequentially supplied to the syndrome calculator circuit, where last symbols of the first codeword overlap with first symbols of the second codeword during an overlap clock cycle; an error locator and error evaluator polynomial calculator circuit configured to compute error locator polynomials and error evaluator polynomials based on the syndrome values; an error location and error value calculator circuit configured to compute error locations based on the error locator polynomials and Forney numerator and denominator values based on the error evaluator polynomials; an error counter and error evaluator circuit configured to count errors based on the error locations and compute error magnitudes based on the Forney numerator and denominator values; and an error corrector circuit configured to correct errors in the first codeword and the second codeword based on the error counts and the error magnitudes.

The description of the syndrome calculator circuit stored on the non-transitory computer-readable medium may include descriptions of: an input interface having an interface width; a first circuit slice configured to compute first syndrome values based on input symbols received from a first portion of the input interface, the first circuit slice may include a first internal syndrome register storing a first accumulated syndrome value; a second circuit slice configured to compute second syndrome values based on input symbols received from a second portion of the input interface in parallel with the first circuit slice, the second circuit slice may include: a second internal syndrome register storing a second accumulated syndrome value; and a third internal syndrome register storing a scaled second accumulated syndrome value; and an output multiplexer configured to selectively output: a sum of the first accumulated syndrome value stored in the first internal syndrome register and the scaled second accumulated syndrome value stored in the third internal syndrome register, during a clock cycle immediately following the overlap clock cycle; and a sum of the first accumulated syndrome value stored in the first internal syndrome register and the second accumulated syndrome value stored in the second internal syndrome register during a clock cycle other than the clock cycle immediately following the overlap clock cycle.

The description of the error locator and error evaluator polynomial calculator stored on non-transitory computer-readable medium may include descriptions of: a plurality of Reformulated Inversion-less Berlekamp Massey (RiBM) instances; a demultiplexer connected to a plurality of inputs of corresponding ones of the RiBM instances; and a multiplexer connected to a plurality of outputs of corresponding ones of the RiBM instances.

The description of the error location and error value calculator circuit stored on the non-transitory computer-readable medium may include descriptions of: a first circuit slice and a second circuit slice configured to compute error locations based on an input error locator polynomial; a register configured to store the input error locator polynomial; and a multiplexer connected to an output of the register and configured to delay supplying the input error locator polynomial to the first circuit slice when the input error locator polynomial corresponds to the second codeword where the first symbols of the second codeword were supplied to the Reed-Solomon decoder circuit during the overlap clock cycle.

The description of the error location and error value calculator circuit stored on the non-transitory computer-readable medium may include descriptions of: a first circuit slice and a second circuit slice configured to compute Forney numerator and denominator values based on an input error evaluator polynomial; a register configured to store the input error evaluator polynomial; and a multiplexer connected to an output of the register and configured to delay supplying the input error evaluator polynomial to the first circuit slice when the input error evaluator polynomial corresponds to the second codeword where the first symbols of the second codeword were supplied to the Reed-Solomon decoder circuit during the overlap clock cycle.

The description of where the error counter and error evaluator circuit stored on the non-transitory computer-readable medium may include descriptions of: an input interface having an interface width; a first circuit slice configured to compute a first error count based on error locations received from a first portion of the input interface, the first circuit slice may include a first error count register storing a first accumulated count of errors; a second circuit slice configured to compute a second error count based on error locations received from a second portion of the input interface in parallel with the first circuit slice, the second circuit slice may include: a second error count register storing a second accumulated count of errors; and a third error count register storing the second accumulated count of errors; and an output multiplexer configured to selectively output: a sum of the first accumulated count of errors stored in the first error count register and the second accumulated count of errors stored in the third error count register, during a clock cycle immediately following the overlap clock cycle; and a sum of the first accumulated count of errors stored in the first error count register and the second accumulated count of errors stored in the second error count register during a clock cycle other than the clock cycle immediately following the overlap clock cycle.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 2A is a timing diagram depicting two codewords being sequentially supplied, without overlap, as input to a Reed-Solomon decoder.

FIG. 2B is a timing diagram depicting two codewords being sequentially supplied, with overlap, as input to a Reed-Solomon decoder.

FIG. 5B is a timing diagram illustrating which values al are tested by a particular Chien-Forney circuit slice of an error location and error value calculator according to one example of the present disclosure to calculate zeroes of a given error location polynomial.

FIG. 7A is a block diagram depicting an error magnitude calculator of an error evaluator according to one example of the present disclosure.

FIG. 8 is a block diagram depicting an error corrector circuit according to one example of the present disclosure.

DETAILED DESCRIPTION

Aspects of the present disclosure relate to throughput efficient Reed-Solomon forward error correction (FEC) decoding.

Many electronic communications protocols make use of forward error correction (FEC) to improve the reliability of communications channels built on those protocols. When a transmitting device transmits message data to a receiving device, the receiving device may receive data that is different from the data that the transmitting device originally transmitted due to noise or interference in the physical communications medium (e.g., wired Ethernet cable) over which the data was transmitted. Therefore, an electronic communications protocol may specify that, when a transmitting device is going to send a message to a recipient, the transmitting device will also apply an encoding technique to generate some additional data based on their message. This additional data may be referred to as parity data or check data. The transmitting device then sends the parity data along with the original message to the receiving device. The combination of the original message and the parity data is typically referred to as a codeword. The receiving device can then use the parity data from the received codeword to verify, with some level of confidence, that the received message in the codeword is the same message that was transmitted by the transmitting device. For example, the receiving device may perform the same encoding computation on the received message and check whether the results of the computation match the received parity data. This is typically referred to as error detection. More complex coding techniques allow a user to detect and also correct errors in those message.

One family of coding techniques are known as Reed-Solomon (RS) codes. Reed-Solomon codes are typically described using a pair of numbers such as RS(N,K), where N is the length of the codeword in symbols and K is the length of the message in symbols, where each symbol corresponds to some number of bits of data (each bit having a value of zero or one). The number of parity symbols 2T is the difference between N and K (2T=N−K). A Reed-Solomon code can detect up to 2T errors in a received codeword and correct up to T errors in the received codeword.

As a concrete example, some standards for high speed Ethernet communications specify the use of RS(544,514) with 10-bit symbols. These include modes operating at 100 Gigabits per second (Gbps), 200 Gbps, 400 Gbps, 800 Gbps, and 1.6 Terabits per second (Tbps). This means that a transmitted codeword has 544 symbols, 514 of which are message symbols and 30 of which are parity symbols. Each of these symbols is 10-bits long, so a single codeword is 544 symbols×10 bits/symbol=5,440 bits long.

Figure 1:
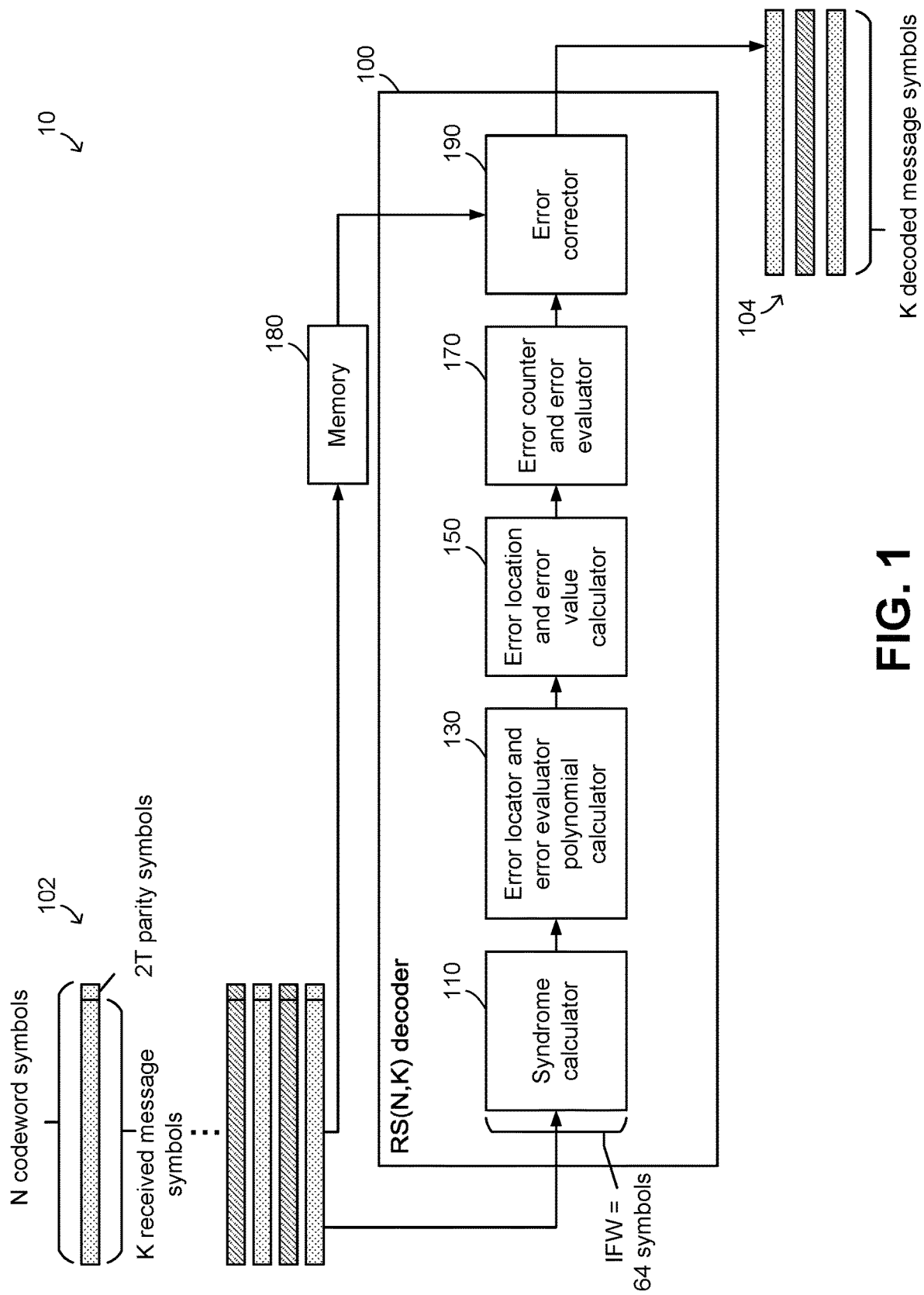
FIG. 1 is a block diagram of a receiving device that includes a Reed-Solomon decoder according to one embodiment of the present disclosure.

FIG. 1 is a block diagram of a receiving device 10 that includes a Reed-Solomon decoder circuit 100 according to one embodiment of the present disclosure. In some examples, the receiving device 10 shown in FIG. 1 is included within a network interface (e.g., network card) of a computing device such as a server computer, but the present disclosure is not limited thereto and may be applied in other contexts involving the use of a Reed-Solomon decoder. The Reed-Solomon decoder 100 is an RS(N,K) decoder that receives a stream of input codewords 102, where each input codeword includes N symbols, where K of these codeword symbols are received message symbols and the remaining 2T=N−K of which are parity symbols. The Reed-Solomon decoder 100 computes output data 104 for each corresponding input codeword, where each output message is computed from a corresponding input codeword and includes K decoded message symbols. In particular, some of the symbols in an input codeword 102 may be corrupted or erased due to, for example, interference and noise in the communication line over which the codeword was transmitted. The Reed-Solomon decoder 100 uses the parity symbols, in combination with the received message symbols, to detect these corrupted symbols or erasures (generally, errors) and, if the number of errors is sufficiently small, to correct these errors. In part As shown in FIG. 1, the Reed-Solomon decoder circuit 100 performs a sequence or pipeline of operations on input codewords 102 to compute the decoded output data 104. The example shown in FIG. 1 includes a syndrome calculator circuit 110, an error locator and error evaluator polynomial calculator circuit 130, an error location and error value calculator circuit 150, an error counter and error evaluator circuit 170, and an error corrector circuit 190.

Some examples of the present disclosure are described herein in the context of a RS(544,514) decoder (where N is 544 and K is 514) that takes in codewords of 544 symbols (514 received message symbols and 30 received parity symbols) and computes an output message of 514 message symbols (e.g., after using the parity symbols to correct errors in the received message symbols).

In order to be able to process high bandwidth data, such as at 1.6 Tbps, some receiving devices process multiple symbols in parallel. The number of symbols that are processed in parallel is referred to as the interface width (IFW) of the receiving device. In the example shown in FIG. 1, the Reed-Solomon decoder circuit 100 has an interface width of 64 symbols, such that, during each clock cycle, the input stream of codewords is processed in chunks of 64 symbols. Various portions of the receiving device 10, such as the portions of the receiving device 10 that read the electronic signals and convert them to digital signals representing input codewords 102 and portions of the receiving device 10 that take the decoded messages 104 and perform further operations, such as writing the data to memory, may have the same interface width (e.g., 64 symbols) as the Reed-Solomon decoder circuit 100.

FIG. 2A is a timing diagram depicting two codewords being sequentially supplied as input to a Reed-Solomon decoder having an interface width of 64 symbols over the course of 18 clock cycles (numbered from 0 to 17). In the example shown in FIG. 2A, the full interface width of 64 symbols is used, indicating that only one port is active (e.g., only port 0 of a multi-port receiving device), and all other ports are inactive. As seen in FIG. 2A, one problem with the particular combination of a codeword length of 544 symbols and an interface width of 64 symbols is that 544 symbols does not divide evenly into chunks of 64. That is, when a first codeword 201 of 544 symbols (shown in FIG. 2A with a dot pattern shading) is processed by the Reed-Solomon decoder circuit 100 with interface width of 64 symbols, then the full capacity of the receiving device will be used during the first eight clock cycles (8 cycles x 64 symbols=512 symbols), but during the ninth clock cycle (cycle with index 8 in FIG. 2A), the Reed-Solomon decoder circuit 100 will have only 32 symbols to process (544 symbols—the 512 symbols processed during the first eight clock cycles) to finish processing the current codeword, and the remaining 32 symbols of processing capacity will go unused (shown in FIG. 2A by the dark crossed shading). The Reed-Solomon decoder circuit 100 waits until the tenth clock cycle (clock cycle index 9) to begin processing the next codeword 202 of 544 symbols (shown in FIG. 2A with a diagonal line pattern shading). A start of codeword (CW) signal and an end of codeword signal respectively indicate the first clock cycle and the last clock cycle of a given codeword.

This unused capacity can be thought of as reducing the bandwidth or throughput of the Reed-Solomon decoder. In order to compensate for the unutilized bandwidth, such that the throughput of the Reed-Solomon decoder circuit 100 (e.g., in terms of symbols per second) matches the other stages of the receiving device 10, the clock frequency of the Reed-Solomon decoder circuit 100 must be increased relative to the clock frequency of the other portions of receiving device 10.

For example, assuming that other portions of the receiving device 10 use the same interface width of 64 symbols, then, during every nine clock cycles, these other portions of the receiving device 10 have a throughput of 64×9=576 symbols. However, as discussed above, in the arrangement shown in FIG. 2, the Reed-Solomon decoder processes only 544 symbols over a period of 9 clock cycles. In order to match the throughput of the other stages, the clock rate of the Reed-Solomon decoder would need to be increased by 576/544≈1.0588 (e.g., approximately 5.9% increase in clock rate). However, having a separate clock signal for the Reed-Solomon decoder circuit 100 increases the complexity of the design, e.g., due to the addition of an additional clock generator and signal lines (a clock tree) for distributing the special clock signal to Reed-Solomon decoder circuit 100. Continuing the above example, to process 1.6 Tbps data rates, the operational clock frequencies are in the rage of about 1.33 GHz, where an increase of about 5.9% would mean that the Reed-Solomon decoder would operate at about 1.408 GHz.

Choosing a different interface width for the Reed-Solomon decoder circuit 100, such 32 symbols, would divide 544 evenly. However, in order to be able to process the input codewords in a timely manner, the clock rate would need to be approximately doubled (e.g., to about 2.5 GHz), which greatly increases power consumption and which requires much tighter timing constraints, thereby greatly increasing the cost of the receiving device. Another approach could be to choose an interface width of 68 symbols, would circumvent this problem because 544 is divided evenly by 68. However, this would cause the Reed-Solomon decoder circuit 100 to have a different interface width than the other portions of the receiving device 10, and may therefore require symbols to be temporarily stored (or buffered) or may require other layers to be redesigned in order to adapt to the different interface width.

To avoid a higher clock frequency, some examples of the present disclosure relate to a Reed-Solomon decoder circuit 100 that maintains the same interface width as other portions of the receiving device 10 and that can receive codewords fed in continuously without leaving unutilized bandwidth when there are more input codewords to be decoded.

FIG. 2B is a timing diagram depicting two codewords being sequentially supplied, with overlap, as input to a Reed-Solomon decoder. As shown in FIG. 2B, the Reed-Solomon decoder circuit 100 process the 544 symbols of a first codeword 251 during the first nine clock cycles (e.g., clock cycles 0 through 8), where, during the ninth clock cycle (clock cycle index 8), the last 32 symbols of the first codeword 251 take up half of the interface width. However, in contrast to FIG. 2A, in the overlapped arrangement shown in FIG. 2B, the first 32 symbols of a second codeword 252 are also processed by the Reed-Solomon decoder circuit 100 during the ninth clock cycle. The remaining symbols of the second codeword 252 are then processed in clock cycles 9 through 16. As such, by including an overlap clock cycle where the processing of symbols from one codeword are overlapped with the processing of symbols from another codeword, the full bandwidth of the Reed-Solomon decoder circuit 100 is used, thereby increasing throughput, such that the two codewords are input over the course of 17 clock cycles (numbered 0 through 16) as opposed to over 18 clock cycles (numbered 0 through 17) as shown in FIG. 2A. Clock cycles 0 through 7 and 9 through 16 as shown in FIG. 2B may be referred to as non-overlap clock cycles because all of the symbols supplied to the Reed-Solomon decoder are from the same codeword.

In particular, during non-overlap clock cycles 0 through 7 only symbols from the first codeword 201 are supplied to the Reed-Solomon decoder circuit, without supplying any symbols from the second codeword 202 during clock cycles 0 through 7. Likewise, during non-overlap clock cycles 9 through 16, only symbols from the second codeword 202 are supplied to the Reed-Solomon decoder circuit, without supplying any symbols from the first codeword 201 during clock cycles 9 through 16. Accordingly, in some examples of the present disclosure, for a given portion of a Reed-Solomon decoder configured to be sequentially supplied with two codewords over the course of a plurality of clock cycles (e.g., 17 clock cycles) with one overlap clock cycle, during a first plurality of non-overlap clock cycles only symbols from a first codeword are supplied to the Reed-Solomon decoder, without supplying symbols from a second codeword during the first plurality of non-overlap clock cycles, and during a second plurality of non-overlap clock cycles, only symbols from the second codeword are supplied to the Reed-Solomon decoder, without supplying symbols from the first codeword during the second plurality of non-overlap clock cycles. During an overlap clock cycle (e.g., between the first plurality of non-overlap clock cycles and the second plurality of non-overlap clock cycles), symbols from both the first codeword and the second codeword are concurrently supplied to the Reed-Solomon decoder. Particular circuits and methods for handling the overlap of codewords will be described in more detail below in reference to various example embodiments of the present disclosure.

Technical advantages of the present disclosure include, but are not limited to a Reed-Solomon Forward Error Correction decoder that is bandwidth and throughput efficient in that the decoder uses its full processing bandwidth as long as it is supplied with input codewords to decode. This allows the Reed-Solomon decoder to be operated at the same clock rate as other portions of the system (e.g., network adapter) and to have the same interface width as the other portions of the system, which improves power efficiency (e.g., by running at a lower clock rate) and which simplifies the design of such a system (e.g., because higher clock rates generally involve tighter timing constraints that are more difficult to satisfy). This improved Reed-Solomon decoder further enables efficient decoding of data in high speed data connections, such as 1.6 Tbps Ethernet connections.

The Reed-Solomon decoder architecture according to examples of the present disclosure also supports sharing of codec hardware supporting independent port speeds (e.g., supporting 200 Gbps, 400 Gbps, 800 Gbps, and 1.6 Tbps), a dynamic interface width for each port, and bandwidth efficient processing of, for example, RS(544,514) codewords at 64 symbols per clock. These features can be provided while achieving low area, low memory footprint, and low latency figures.

Referring back to FIG. 1, the Reed-Solomon decoder circuit 100 includes a pipeline for performing Reed-Solomon decoding of input codewords. In more detail, the syndrome calculator circuit 110 takes the input codeword of received message symbols and received parity symbols and computes corresponding syndrome symbols based on particular linear combinations of the symbols of the codeword, as will be discussed in more detail below. The syndrome symbols are supplied to the error locator and error evaluator polynomial calculator circuit 130, which uses the syndrome symbols to compute an error locator polynomial and an error evaluator polynomial that will be used to, respectively, locate errors and to determine the correct values of the symbols at those error locations. The error location and error value calculator circuit 150 computes the locations of any errors in the received codeword and the values of those errors. The output of the error location and error value calculator circuit 150 are provided to an error counter and error evaluator circuit 170, which determines the error magnitude and the error count from the output of the error location and error value calculator circuit 150. The error corrector circuit 190 combines the error magnitude from the error counter and error evaluator circuit 170 to the input codeword 102 to generate the output data 104. In some circumstances, too many symbols of the input codeword are corrupted for the RS(N,K) decoder to correct all of the errors (e.g., there are more than T errors), in which case the RS(N,K) decoder signals an error regarding the decoding of that particular codeword.

The Reed-Solomon decoder circuit 100 according to some examples supports multiple ports (e.g., multiple separate streams of data), where different streams of data are processed by different circuit slices of the stages of the pipeline. For example, the syndrome calculator circuit 110 may include multiple circuit slices for computing syndromes for different input codewords in parallel (e.g., at a lower data rate). The multiple circuit slices are reconfigurable based on switching logic of the Reed-Solomon decoder such that the circuit slices work together or work independently, depending on the port configuration. For example, in the case of operating the Reed-Solomon decoder circuit 100 to decode codewords received on a single port operating at 1.6 Tbps, all of the circuit slices may be configured to decode these codewords (e.g., with a total interface width of 64 symbols). As another example, in the case of operating the Reed-Solomon decoder circuit 100 to decode codewords received on two ports, each operating at 800 Mbps, the circuit slices may be configured to process two different codewords in parallel (e.g., each circuit slice having an interface width of 32 symbols). As will be described in more detail below, the multiple circuit slices available at various stages of the pipeline of the Reed-Solomon decoder circuit 100 are used to implement decoding of codewords that overlap during a clock cycle, such as in the circumstances shown in FIG. 2B, where two codewords overlap during the ninth clock cycle.

Implementations of these portions of the pipeline according to various examples of the present disclosure will be discussed in more detail below.

Figure 3:
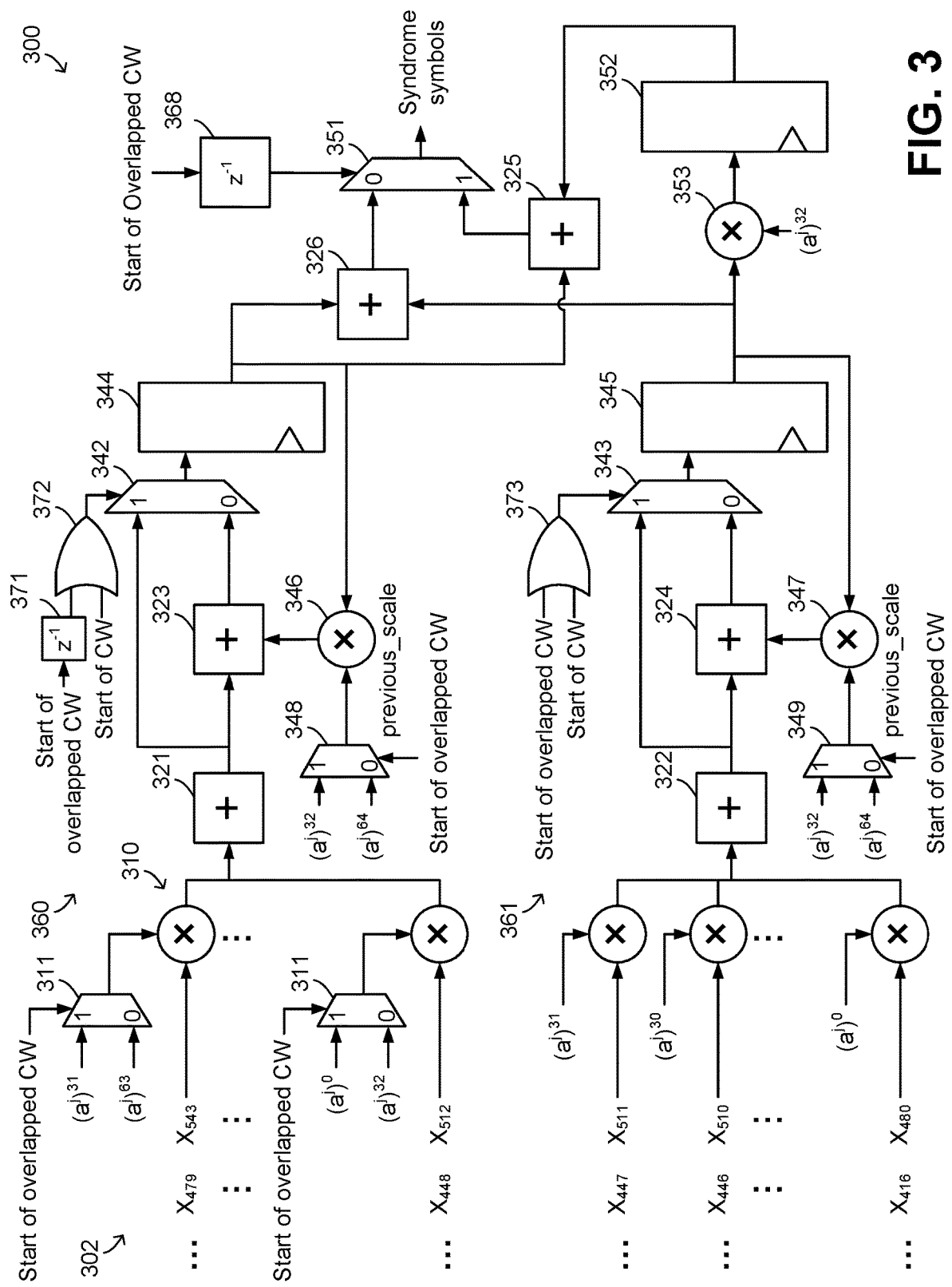
FIG. 3 is a block diagram of a syndrome calculator according to one example of the present disclosure.

FIG. 3 is a block diagram of a syndrome calculator 300 according to one example of the present disclosure. In Reed-Solomon decoding, a received codeword can be interpreted as a polynomial. The values obtained from evaluating this polynomial at particular points (in particular, at 2T different points) are referred to as syndrome values or syndromes. These syndrome values relate to errors in the received codeword. In a case where all of the syndrome values are all zero, then the Reed-Solomon decoder indicates that, with high probability (e.g., with high confidence), the message was not corrupted in transit. On the other hand, if at least some of the syndrome values are non-zero, then there are one or more errors in the received codeword and further computations may be used to locate and correct the errors in the received message.

In more detail, the syndrome calculator 300 evaluates a received codeword made up of a plurality of m-bit symbols at $a^j$ where a is the primitive element of the Galois field $GF(a^m)$ and $0 \leq j < 2T$ (as noted above, 2T=30 for RS(544, 514)). The block diagram shown in FIG. 3 depicts one portion of the syndrome calculator 300 configured to calculate a syndrome value sdm for a particular value of j. Accordingly, a syndrome calculator 110 in some examples of the present disclosure includes 2T syndrome calculators arranged in parallel (e.g., 30 syndrome calculators arranged in parallel), where each of the 2T syndrome calculators computes a different syndrome value sdm[j] for each value of j where $0 \leq j < 2T$.

A Galois field or finite field refers to a field of a finite number of elements. Here, $GF(a^m)$ indicates that the values in the field are limited to values of 0 through $a^m-1$. In the particular example of 10 bit symbols, each symbol can be considered to correspond to an integer and where a=2, the field includes $2^{10}=1024$ symbols, e.g., integers from 0 through 1023. Standard arithmetic operations such as addition, subtraction, multiplication, and division also exist when operating in a Galois field, but have different behavior than in standard arithmetic because the results from performing these operations must also be members of the finite field. For example, Galois field (GF) adding 512 to 10 in GF(1024) results in the value of 522, as expected in standard arithmetic. However, GF adding 512 to 768 results in 256, not 1280, because 1280 is outside the finite field (1280 is greater than the maximum value of 1023 that is allowed in $GF(2^{10})$). Galois field subtraction results in similar wrap-around when the result would be negative in standard arithmetic. Galois field (GF) multiplication operations can result in similar "wrap around" results. Galois field division operations do not result in fractional quotients when the dividend is not an integer multiple of the divisor, but instead are also values from the Galois field and are most easily understood in terms of being the inverse of the GF multiplication operation, where a quotient q of a numerator n GF divided by denominator d is finding a value q such that q GF multiplied by d is equal to n.

In the particular example of a codeword of 544 symbols, the received codeword can be expressed as $\{X_{543},$ $X_{542}, \ldots, X_1, X_0\}$ where $X_j$ is a symbol (e.g., m-bit value) at position j in the codeword. In this case, the syndrome calculator 300 evaluates the received codeword at as to compute a syndrome value (sdm) at each position j in accordance with:

$$sdm[j]=X_{543}((a^j)^{543})+X_{542}((a^j)^{542})+ \ldots +X_1((a^j)^1)+ X_0((a^j)^0)$$

For example, to produce 2T syndrome values, the syndrome calculator circuit 110 includes 2T different syndrome calculators 300 arranged in parallel (e.g., the circuit shown in FIG. 3 is replicated 2T times in the syndrome calculator circuit 110 and configured with different corresponding values of j) to evaluates sdm[j] for each value of j where $0 \leq j < 2T$.

The particular example shown in FIG. 3 will be described in the context of a Reed-Solomon decoder with an interface width of 64 symbols, although the present disclosure is not limited thereto. In particular, the syndrome calculator 300 has an input 302 having an interface width of 64 symbols. Sixty-four codeword symbols of the codeword are fed into the input 302 at a time, starting from the highest-indexed symbols, starting with $X_{543}$ through $X_{480}$ during a first clock cycle, followed by $X_{479}$ through $X_{416}$ in a second clock cycle, and so on, as shown on the left side of FIG. 3 and as shown in the timing diagram of FIG. 2B.

As shown in FIG. 3, the syndrome calculator 300 is divided into two circuit slices: a first circuit slice (slice 0) or upper circuit slice 360 that processes the higher-indexed positions (e.g., positions 63 through 32) and a second circuit slice (slice 1) or lower circuit slice 361 that processes the lower-index positions (e.g., positions 31 through 0). During the ninth clock cycle (the overlap clock cycle) shown in FIG. 2B, slice 1 or the lower circuit slice 361 starts processing the overlapped codeword or odd codeword 252 while slice 0 or the upper circuit slice 360 is still processing the previous (non-overlapped or even) codeword 251. The start of overlapped CW signal indicates an overlap clock cycle.

A plurality of GF multipliers 310 equal to the interface width (e.g., 64 multipliers) receive input codeword symbols (e.g., 64 of the input codeword symbols) and GF multiply the symbols by their corresponding weights. The weights differ, depending on whether the current clock cycle is a clock cycle corresponding to the start of an overlapped codeword (CW) (e.g., an overlap clock cycle). In particular, in most clock cycles, the symbol $X_i$ at position i of the decoder input 302 is multiplied by $(a^j)^i$ where $0 \leq i < 64$, but during an overlap clock cycle, when the start of overlapped CW signal is high, then the weights $(a^j)^i$ where $0 \leq i < 32$ are supplied to both the first 32 positions and to the second 32 positions of the GF multipliers 310. In particular, as shown in FIG. 3, a plurality of demultiplexers 311 select the weights $(a^j)^i$ where $0 \leq i < 32$ for the GF multipliers 310 of the first circuit slice (slice 0) 360 when the start of overlapped CW signal is high and selects weights $(a^j)^i$ where $32 \leq i < 64$ otherwise.

In the example shown in FIG. 3, the first circuit slice (slice 0) 360 and the second circuit slice (slice 1) 361 can operate independently (e.g., to process two separate streams of codewords where each stream uses half of the interface width, e.g., each uses 32 symbols of the 64 symbol interface width). Accordingly, the first circuit slice (slice 0) 360 and the second circuit slice (slice 1) 361 may be structurally similar, as described in more detail below.

In the example shown in FIG. 3, the first circuit slice (slice 0) 360 includes a first GF adder 321 GF configured to sum the GF products for the first circuit slice (slice 0) 360 (e.g., positions i for 32 through 63). Likewise, the second circuit slice (slice 1) 361 includes a second GF adder 322 GF configured to sum the GF products for the second circuit slice (slice 1) 361 (e.g., positions i for 0 through 31).

For the first cycle of a non-overlapped codeword (or even codeword), where the first 64 symbols of the codeword ($X_{543}$ through $X_{480}$) are supplied in parallel to the decoder input 302 (e.g., codeword 251 of FIG. 2A), selects the GF sum computed by the first GF adder 321 and initializes a first accumulated syndrome value stored in a first internal syndrome register 344 with this GF sum of each $X_i$ multiplied with $(a^j)^i$ (sum of all 32 terms is the current accumulated value) using a first initialization multiplexer 342 controlled by the start of CW signal or during the clock cycle immediately after the start of overlapped CW signal (as delayed by the delay line 371) as determined by first OR gate 372, as shown in FIG. 2B.

Likewise, a second initialization multiplexer 343 selects the GF sum computed by the second GF adder 322 and initializes a second accumulated syndrome value stored in a second internal syndrome register 345 with this GF sum of each $X_i$ multiplied with $(a^j)^i$ (sum of all 32 terms is the current accumulated value), as indicated by the start of CW signal or the start of overlapped CW signal as determined by second OR gate 373 shown in FIG. 2B.

In successive clock cycles, the GF sum computed by the first GF adder 321 of the first circuit slice (slice 0) 360 is GF added by a third GF adder 323 to the first accumulated syndrome value (stored in the first internal syndrome register 344) after the first accumulated syndrome value is scaled by a first scaling GF multiplier 346 by a factor referred to as previous_scale=$(a^j)^S$. Likewise, in these successive cycles, the GF sum computed by the second GF adder 322 of the second circuit slice (slice 1) 361 is GF added by a fourth GF adder 324 to the second accumulated syndrome value (stored in the second internal syndrome register 345) after the second accumulated syndrome value is scaled by a second scaling GF multiplier 347 by the previous_scale=$(a^j)^S$.

Scaling the sum of the values by $(a^j)^S$ may be equivalent to multiplying each of the terms by $(a^j)^{i+S}$, such that, once all of the symbols of the codeword have been fed into the syndrome calculator circuit 110, each of the terms is multiplied by its corresponding coefficient (e.g., $X_{543}$ will eventually be multiplied by $(a^j)^{543}$) in accordance with the equation for sdm[j] given above. Accordingly, in the tenth clock cycle, after the entire codeword has entered the syndrome calculator 300, the syndrome calculator produces sdm[j] for a value of j where $0 \leq j < 30$. By using 2T (e.g., 30) different syndrome calculators 30 in parallel, each evaluating sdm[j] for a different value of j, the syndrome calculator circuit 110 evaluates sdm[j] for each value of j where $0 \leq j < 30$.

When the syndrome calculator 300 is configured to perform overlapping processing (processing where some adjacent codewords are overlap in a clock cycle, such as the ninth clock cycle as shown in FIG. 2B), the previous_scale value is modified as follows. For non-overlapped codewords (or even codewords, e.g., where the first symbols supplied to the syndrome calculator do not overlap with another codeword, where FIG. 2B shows an example of a non-overlapped codeword or even codeword 251), S=64 for first 8 clock cycles, and S=32 for the 9th clock cycle (the last codeword symbols of the codeword).

For overlapped codewords or odd codewords (e.g., where the first symbols supplied to the syndrome calculator do overlap with another codeword, where FIG. 2B shows an example of an overlapped or odd codeword 252), S=32 for the first clock cycle (where the first symbols overlap or are processed together with the last symbols of the previous codeword), and S=64 for remaining 8 clock cycles. Note that this assumes that the first clock cycle that processes symbols of an overlapped or odd codeword (e.g., overlapped codeword 252 of FIG. 2B) must be in the last clock cycle that processes symbols of a non-overlapped codeword or even codeword (e.g., non-overlapped codeword 251 of FIG. 2B). Accordingly, S is set to 32 for the clock cycle where two codewords overlap, which may be referred to as an overlap clock cycle. In particular, in the example shown in FIG. 3, a first previous scale demultiplexer 348 of the first circuit slice (slice 0) 360 sets the value of previous_scale supplied to the first scaling GF multiplier 346 to $(a^j)^{32}$ during overlap clock cycles (when the start of overlapped CW signal is high) and sets the value of previous_scale to $(a^j)^{64}$ during other clock cycles (non-overlap clock cycles, when the start of overlapped CW signal is low). Likewise, a second previous scale demultiplexer 349 of the second circuit slice (slice 1) 361 sets the value of previous_scale supplied to the second scaling GF multiplier 347 to $(a^j)^{32}$ during overlap clock cycles (when the start of overlapped CW signal is high) and sets the value of previous_scale to $(a^j)^{64}$ during other clock cycles (non-overlap clock cycles, when the start of overlapped CW signal is low).

After all of the symbols from a non-overlapped codeword have been input into the syndrome calculator 300 (e.g., after the $9^{th}$ clock cycle), the first internal syndrome register 344 stores the accumulated syndrome value for the portion of the codeword that was processed by the first circuit slice (slice 0) 360. The second internal syndrome register 345 stores the accumulated syndrome value computed by the portion of the codeword that was processed by the second circuit slice (slice 1) 361, but this value is reinitialized due to the start of the overlapped codeword. Therefore, the syndrome calculator 300 includes a third internal syndrome register 352 in the second circuit slice (slice 1) to store the previous accumulated syndrome data computed from the non-overlapped (or even) codeword, as scaled by a third scaling GF multiplier 353, which scales the previous accumulated syndrome data by $(a^j)^{32}$.

During the cycle immediately after the overlap clock cycle (e.g., during the $10^{th}$ clock cycle), an output multiplexer 351 selects the sum of the value stored in the first internal syndrome register 344 and the output of a third internal syndrome register 352, as computed by a fifth GF adder 325, such that the syndrome values sdm[j] for the overlapped codeword are calculated in accordance with:

$$sdm\_slice1\_r[j] <= (sdm\_slice1[j])*(a^i)^{32}$$

$$sdm[j] = sdm\_slice0[j] + sdm\_slice1\_r[j]$$

where $0 \le j < 30$. In particular, to be triggered in the clock cycle immediately after the overlap clock cycle, a delay line 368 delays the start of overlapped CW signal by one clock cycle before supplying the delayed signal to control the output multiplexer 351. Accordingly, the syndrome calculator 300 generates a valid output representing the syndrome symbols for a non-overlapped codeword during the clock cycle immediately after the end of the non-overlapped codeword (e.g., the clock cycle immediately after the start of overlapped codeword signal).

In the case of an overlapped codeword, the first circuit slice (slice 0) 360 and the second circuit slice (slice 1) 361 both finish computing the syndrome values from their respective portions of the codeword during the same cycle, and therefore the third internal syndrome register 352 is not needed for computing the syndrome value for an overlapped codeword. The output multiplexer 351 selects the output of a sixth GF adder 326, which adds the accumulated values stored in the first internal syndrome register 344 and the second internal syndrome register 345 during the cycle after the end of the overlapped codeword (e.g., during the $18^{th}$ clock cycle).

Accordingly, the syndrome calculator 300 shown in FIG. 3 computes a j-th syndrome value for an input codeword, and a syndrome calculator circuit 110 includes 2T copies of the syndrome calculator 300, each configured with a different value of j (where $0 \le j < 2T$), such that the syndrome calculator circuit 110 computes 2T syndrome symbols or syndrome values (e.g., 30 syndrome symbols in the case of RS(544,514)) for each input codeword. The output of the syndrome calculator 300 is valid only during the clock cycles immediately following the end of a codeword (e.g., the clock cycle immediately following the end of CW signal, as shown an FIG. 2B such as during the $10^{th}$ clock cycle having index 9 in FIG. 2B and the $18^{th}$ clock cycle having index 17 in FIG. 2B). Referring back to FIG. 1, syndrome values calculated by the syndrome calculator circuit 110 are supplied to an error locator and error evaluator polynomial calculator circuit 130. When codewords are fed with overlap to the Reed-Solomon decoder circuit 100, in order to maintain full throughput, the error locator and error evaluator polynomial calculator circuit 130 should calculate two successive error locator/error evaluator polynomials in 17 cycles.

Figure 4:
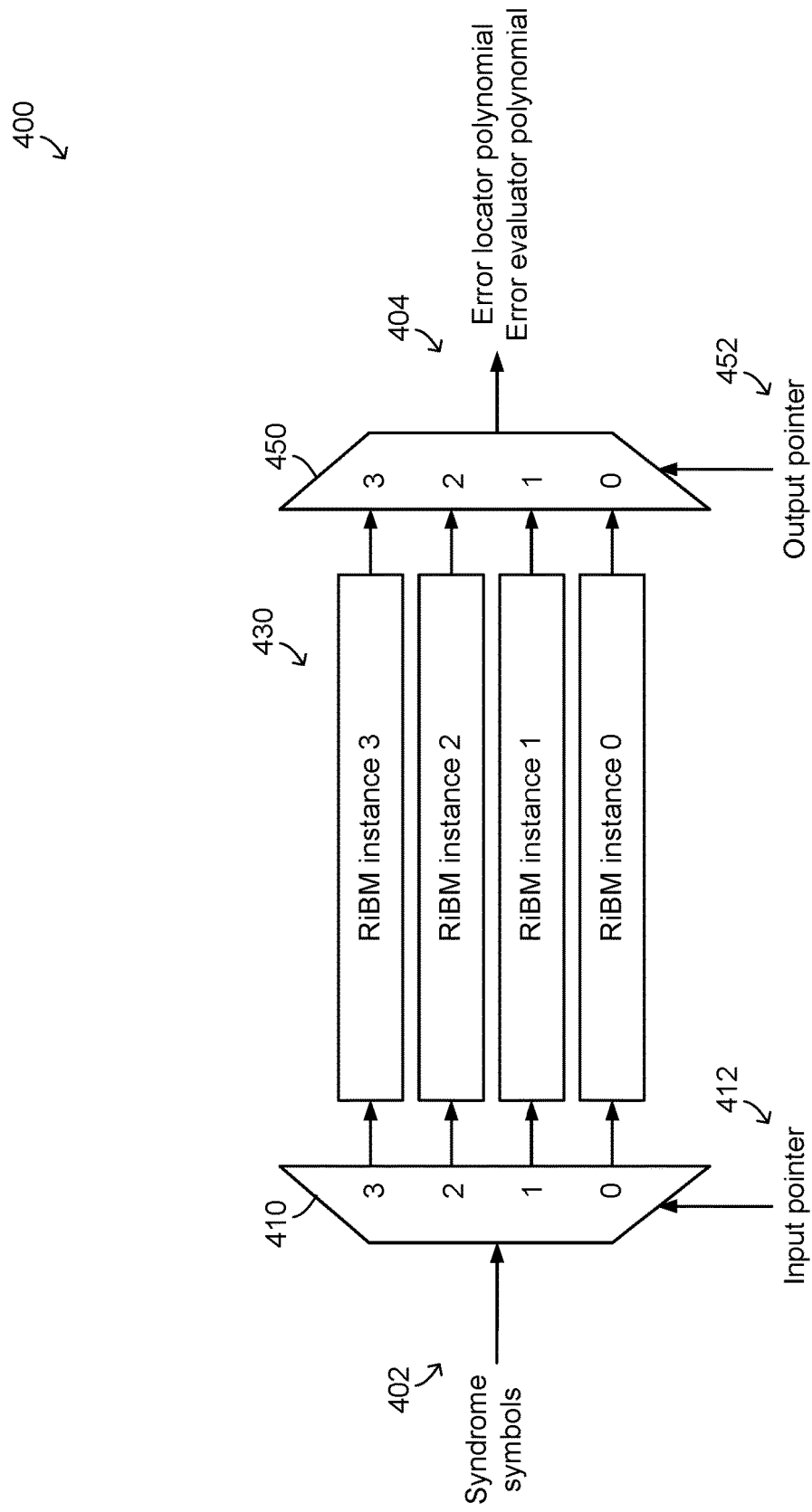
FIG. 4 is a block diagram depicting an error locator and error evaluator polynomial calculator according to one example of the present disclosure.

FIG. 4 is a block diagram depicting an error locator and error evaluator polynomial calculator 400 according to one example of the present disclosure. Given the syndrome values, according to some embodiments, a hardware implementation of the Reformulated Inversion-less Berlekamp Massey (RiBM) algorithm iteratively computes the error locator and error evaluator polynomials based on the input symbols.

The syndrome calculator circuit 110 takes one clock cycle after end of codeword feed to generate a syndrome value for the codeword. However, the latency of the RiBM calculator is 2T, and, in the case of RS(544,514) as discussed above, 2T=30. Therefore, after receiving a set of syndrome values for a first codeword, the RiBM calculator will not finish computing the error locator polynomial and error evaluator polynomial until 30 cycles later. However, additional syndrome values will arrive, on average, 8.5 clock cycles later (8 or 9 clock cycles later depending on whether they were computed from an overlapped/odd codeword or from a non-overlapped/even codeword), and, in order to maintain throughput, these additional syndrome values cannot wait for the RiBM calculator to finish computing the error locator and error evaluator polynomial calculator for previous codewords.

Hence, according to some examples of the present disclosure, the error locator and error evaluator polynomial calculator 400 includes multiple RiBM instances or RiBM circuits that operate in parallel, where the syndrome values calculated for successive codewords are demultiplexed to multiple RiBM circuits in order for the error locator and error evaluator polynomial calculator 400 to be able to maintain the throughput of Reed-Solomon decoder (e.g., to compute two successive error locator and error evaluator polynomials every 17 cycles).

In more detail, syndrome values for successive codewords are generated by the syndrome calculator on the $10^{th}$, $18^{th}$, $27^{th}$, $35^{th}$, ..., $I_{n-1}$, $(I_{n-1}+(9-n \% 2))$ clock cycles after the first symbols of the codewords are supplied as input to the syndrome calculator, assuming that the stream of data input to the Reed-Solomon decoder circuit 100 is continuous, and assuming that each alternate codeword is an overlapped or odd codeword.

With a latency of 2T=30 cycles, a RiBM circuit computes error locator and error evaluator polynomials on $(10+30)^{th}$, $(18+30)^{th}$, $(27+30)^{th}$, . . . clock cycles.

Hence, syndromes for three additional codewords are calculated by the syndrome calculator while the RiBM circuit computes error locator and error evaluator polynomials for first codeword. Therefore, to avoid delay or buffering and to maintain the throughput of the Reed-Solomon decoder, three additional RiBM circuits are included in the error locator and error evaluator polynomial calculator 400, for a total of four RiBM circuits, as shown in FIG. 4. While four RiBM circuits are shown herein for the particular case where 2T=30 and where syndrome values are computed every 8.5 cycles, the present disclosure is not limited thereto, and other combinations of the value 2T and number of cycles between the computation of syndrome values for successive codewords may result in an error locator and error evaluator polynomial calculator having different numbers of RiBM circuits (e.g., 2T divided by the number of cycles between syndrome values for successive codewords, rounded up). In general, number of RiBM circuits is given by:

Number of *RiBM* circuits =

$$\begin{cases} 2T/(IFW/\text{CW\_SIZE}) & \text{if } 2T \, \%(IFW/\text{CW\_SIZE}) = 0 \\ 1 + 2t/(IFW/\text{CW\_SIZE}) & \text{otherwise} \end{cases}$$

where IFW is the interface width in symbols and CW_size is the codeword size in symbols. As noted above, for 2T=30, IFW=64 symbols per clock, and CW_SIZE=544, the number of RiBM circuits is 1+30/8.5=4.

As shown in FIG. 4, the error locator and error evaluator polynomial calculator 400 receives syndrome symbols at its input 402 and produces an error locator polynomial and an error evaluator polynomial 404 for each set of syndrome symbols corresponding to a codeword. The input 402 to the error locator and error evaluator polynomial calculator 400 is connected to a demultiplexer 410, which supplies the syndrome symbols to one of four different RiBM circuits 430, labeled in FIG. 4 as RiBM circuit 0, RiBM circuit 1, RiBM circuit 2, and RiBM circuit 3.

The demultiplexer 410 of the error locator and error evaluator polynomial calculator 400 selectively supplies the syndrome symbols to one of the RiBM circuits as controlled by an input pointer 412. Likewise, a multiplexer 450 of the error locator and error evaluator polynomial calculator 400 selectively connects one of the RiBM circuits to the output 404 of the error locator and error evaluator polynomial calculator 400 in accordance with an output pointer 452. The input pointer 412 increments on each valid syndrome (input_pointer increment flag=syndrome valid), and the demultiplexer 410 routes the syndrome symbols to one of the RiBM circuits in a round-robin fashion (e.g., starting with RiBM circuit 0, then RiBM circuit 1, then RiBM circuit 2, then RiBM circuit 3, and then back to RiBM circuit 0, and so on). The output pointer 452 increments when the next RiBM output becomes valid (e.g., 2T clock cycles after supplying the input syndrome symbols to the RiBM circuit, output_pointer increment flag=Kribm out valid)) such that the multiplexer 450 connects the RiBM circuit that is generating valid output to the output 404 of the error locator and error evaluator polynomial calculator 400.

Accordingly, an error locator and error evaluator polynomial calculator 400 according to the present disclosure is configured to compute error locator and error evaluator polynomials based on input syndrome symbols without reducing the throughput of the Reed-Solomon decoder by including multiple RiBM circuits and selecting between the RiBM circuits. For example, in the context of a Reed-Solomon decoder where 2T=30, IFW=64 symbols per clock, and CW_SIZE=544, the four RiBM circuits are sufficient to generate two valid RiBM outputs (error locator and error evaluator polynomials) every 17 cycles (assuming that the codewords alternate between non-overlapped/even codewords and overlapped/odd codewords, such as in the arrangement shown in FIG. 2B).

The error locator polynomial and error evaluator polynomial computed by the error locator and error evaluator polynomial calculator circuit 130 (e.g., the error locator and error evaluator polynomial calculator 400 having multiple RiBM circuits shown in FIG. 4) are supplied as input to an error location and error value calculator circuit 150, which computes the roots or zero-crossings of the error locator polynomial to identify locations of any errors in the received codeword and solves the error evaluator polynomial to recover the correct values of the symbols at the locations of the errors. One technique for finding the roots of polynomials is known in the art as a Chien search, and one technique for calculating error values at known error locations based on an error evaluator polynomial is known in the art as the Forney algorithm. Accordingly, in some examples of the present disclosure the disclosure include a Chien-Forney circuit configured to perform a Chien search to compute the roots of an error locator polynomial calculated by an RiBM circuit and to perform a Forney algorithm to compute the error values based on the error evaluator polynomial.

In some examples, a Chien-Forney circuit evaluates the received error locator and error evaluator polynomials for each $(a^{-k})$ where $0 \le k < \text{CW\_SIZE}$, e.g., $0 \le k < 544$ in the case of an RS(544,514) code as discussed above.

An error locator polynomial, as computed by a RiBM circuit, is given by coefficients $\{\Lambda_{15}, \Lambda_{14}, \ldots, \Lambda_0\}$, and this polynomial evaluated at $a^{-k}$ is $$\Lambda(a^{-k}) = \Lambda_{15}(a^{-k})^{15} + \Lambda_{14}(a^{-k})^{14} + \ldots + \Lambda_0(a^{-k})^0$$

If this value is equal to zero, then $a^{-k}$ is a root of error locator polynomial and a k is an error location.

An error evaluator polynomial, as calculated by a RiBM circuit, is given by coefficients $\{\Omega_{14}, \Omega_{13}, \ldots, \Omega_0\}$ and this polynomial evaluated at $a^{-k}$ is:

$$\Omega(a^{-k}) = \Omega_{14}(a^{-k})^{14} + \Omega_{13}(a^{-k})^{13} + \ldots + \Omega_0(a^{-k})^0$$

The Chien-Forney circuit scales this value by a factor $(a^{-k})^{2T}$ (e.g., $(a^{-k})^{30}$) to compute a numerator in accordance with Forney's error value formula, and the denominator in accordance with Forney's error value formula is given by the odd terms of the evaluated error locator polynomial:

Numerator=$(a^{-k})^{30} \Omega(a^{-k})$

Denominator=$(a^{-k}) \Lambda'(a^{-k})$

Where $\Lambda'$ is the derivative of the error locator polynomial $\Lambda$, which will have only the odd coefficients of $\Lambda$ and the powers reduced by 1 (e.g., $\Lambda' = \Lambda_{15}(a^{-k})^{14} + \Lambda_{13}(a^{-k})^{12} + \ldots + \Lambda_1(a^{-k})^0)$.

The computed Forney numerator and denominator are provided to the error evaluator to compute the error magnitudes, as discussed in more detail below.

Figure 5A:
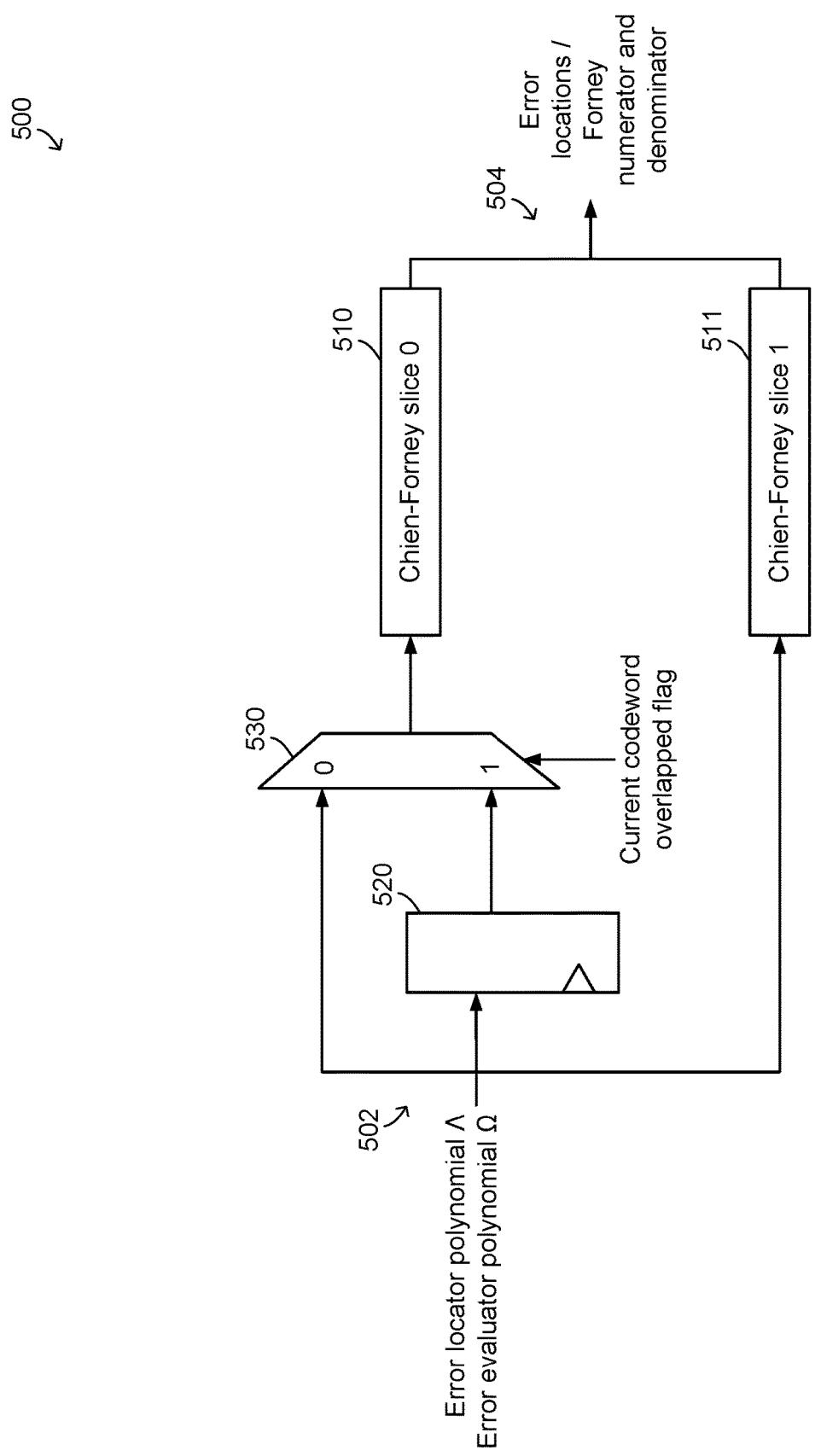
FIG. 5A is a block diagram of an error location and error value calculator according to one example of the present disclosure.

FIG. 5A is a block diagram of an error location and error value calculator 500 according to one example of the present disclosure. In the case of overlapping codeword processing according to some examples of the present disclosure (e.g., where two different codewords overlap during an overlap clock cycle as shown in FIG. 2B), the Chien-Forney (chfr) circuit is divided into multiple circuit slices: a first circuit slice (slice 0) 510 and a second circuit slice (slice 1) 511, where each circuit slice evaluates the error locator polynomial and the error evaluator polynomial for 32 candidate roots during a given clock cycle. As noted above, performing a Chien search involves evaluating an error locator polynomial at every position (e.g., 0≤k<544 in the case of an RS(544,514) code as discussed above) and computing the Forney numerator involves evaluating the error evaluator polynomial at these locations. In a similar manner to that described above with respect to supplying input codewords to the syndrome calculator circuit 110 of the Reed-Solomon decoder, as shown in FIG. 2B and FIG. 3, the 544 positions at which the error locator polynomial Λ and the error evaluator polynomial Ω are to be evaluated does not divide evenly into a data path that evaluates 64 possible positions during each clock cycle (e.g., the 32 different possible positions evaluated by each of the two circuit slices 510 and 511 of the Chien-Forney circuit). Therefore, in a similar manner to that shown above with respect to FIG. 2B, aspects of the present disclosure relate to performing a Chien-Forney operation in a manner where error locator polynomials and error evaluator polynomials corresponding to two different codewords are supplied to an input 502 and evaluated, in part, during a same clock cycle (overlap clock cycle), as described in more detail below.

FIG. 5B is a timing diagram illustrating which values aI are tested by a particular Chien-Forney circuit slice of an error location and error value calculator according to one example of the present disclosure to evaluate a given error location polynomial and a given error evaluator polynomial. As shown in FIG. 5B, for an error locator polynomial and an error evaluator polynomial corresponding to a non-overlapped or even codeword 551 (such as non-overlapped codeword 251 as shown in FIG. 2B where the first symbols of the codeword to enter the decoder are not overlapping with another codeword) supplied to an input 502 of the error location and error value calculator 500, the first circuit slice (slice 0) 510 of the Chien-Forney circuit 500 evaluates the error locator and error evaluator polynomials at $[a^{-543+64*i}, a^{-512+64*i}]$ for clock cycles 0≤i<9, and a second circuit slice (slice 1) 511 of the Chien-Forney circuit 500 evaluates the error locator and error evaluator polynomials at $[a^{-511+64*i}, a^{-480+64*i}]$ for 0≤i<8. While this provides one example of the allocation of work between the first circuit slice 510 and the second circuit slice 511 of the Chien-Forney circuit, the present disclosure is not limited thereto and the testing of positions may be allocated to the circuit slices in a different order.

As noted above, because 544 is not divided evenly by 64, during the 9$^{th}$ clock cycle (e.g., clock cycle 8 as shown in FIG. 5B), there are no additional values of aI for the second circuit slice (slice 1) 511 to test (e.g., slice 0 tests values $[a^{-31}, a^0]$ during the 9th clock cycle). Therefore, the second circuit slice (slice 1) 511 can start evaluating the error locator polynomial and the error evaluator polynomial corresponding to the next codeword 552 (e.g., the overlapped or odd codeword) during this 9$^{th}$ clock cycle, and the first circuit slice (slice 0) 510 can begin evaluating the error locator polynomial and the error evaluator polynomial for the next codeword 552 during a following clock cycle (e.g., the 10$^{th}$ clock cycle). More precisely, for an overlapped/odd codeword 552, the first circuit slice (slice 0) 510 evaluates error locator and error evaluator polynomials at $[a^{-511+64*i}, a^{-480+64*i}]$ for 0≤i<8, and the second circuit slice (slice 1) 511 evaluates the error locator and error evaluator polynomials at $[a^{-543+64*i}, a^{-512+64*i}]$ for 0≤i<9. In a similar manner, while this provides one example of the allocation of work between the first circuit slice 510 and the second circuit slice 511 of the Chien-Forney circuit 500, the present disclosure is not limited thereto and the testing of positions may be allocated to the circuit slices in a different order.

In order to delay the supplying of the error locator polynomial and the error evaluator polynomial to the first circuit slice (slice 0) 510, the Chien-Forney circuit further includes a register 520 and a multiplexer 530. The register 520 is configured to store the error locator polynomial and the error evaluator polynomial that were supplied at the input 502. A current codeword overlapped flag controls the operation of the multiplexer 530. When the current codeword is not overlapped, then the error locator polynomial and the error evaluator polynomial supplied at the input 502 is fed directly to both the first circuit slice (slice 0) 510 (through the multiplexer 530) and the second circuit slice (slice 1) 511. However, when the current codeword overlapped flag is high, then the register 520 delays the supplying of the error locator polynomial and the error evaluator polynomial to the first circuit slice (slice 0) 510 by one clock cycle, relative to the supplying of the error locator polynomial to the second circuit slice (slice 1) 511. This delay is used because slice 0 cannot start processing the next set of polynomials until the current computation is complete. Because the second circuit slice (slice 1) started processing one cycle early compared to the first circuit slice (slice 0), both circuit slices complete their computations for the overlapped or odd codeword 552 on the same cycle (e.g., the 17$^{th}$ clock cycle, labeled clock cycle 16 in FIG. 5B).

As a result, as shown in FIG. 5B, Chien-Forney evaluations of the error locator polynomial and error evaluator polynomial for two different codewords can be completed in 17 clock cycles and produced at an output 504 of the error locator and error value calculator 500, such that this allocation of work across the multiple circuit slices of the Chien-Forney circuit maintains the throughput of the Reed-Solomon decoder circuit 100 (e.g., matching the 2 codewords every 17 clock cycles of the syndrome calculator circuit 110 and of the error locator and error evaluator polynomial calculator circuit 130). The error locations may be represented as a sequence of symbol_error vectors during each clock signal, each symbol_error vector having a width equal to the interface width of the Reed-Solomon decoder, e.g., an interface width of 64 with values at positions symbol_error[0] through symbol_error[63], where a value of 0 indicates no error at a particular location (e.g., where the error locator polynomial Λ did not evaluate to 0) and a value of 1 indicates an error at that location (e.g., where the error locator polynomial Λ evaluated to 0), where successive clock symbols provide the error locations for successive portions of the corresponding codeword in chunks equal to the interface width (e.g., for a non-overlapped or even codeword, positions 543 through 480 for the first clock cycle, positions 479 through 416 during the second clock cycle, positions 415 through 352 during the third clock cycle, and the like, and, for an overlapped or odd codeword, positions 543 through 512 during the first clock cycle, positions 511 through 448 during the second clock cycle, positions 447 through 384 during the third clock cycle, and the like).

While the above description relates to allocation of the work of testing of values $a^{-j}$ across two circuit slices of a Chien-Forney circuit, the present disclosure is not limited thereto and may be divided into more than two circuit slices (e.g., four circuit slices).

While FIG. 5A and the above description depicts a same circuit operating on both an error locator polynomial Λ and an error evaluator polynomial Ω, the present disclosure is not limited thereto. For example, FIG. 5C depicts an example of the present disclosure in which separate circuits are used for performing an error location calculation 560 based on an error locator polynomial Λ and an error value calculation 580 based on an error evaluator polynomial Ω.

Figure 5C:
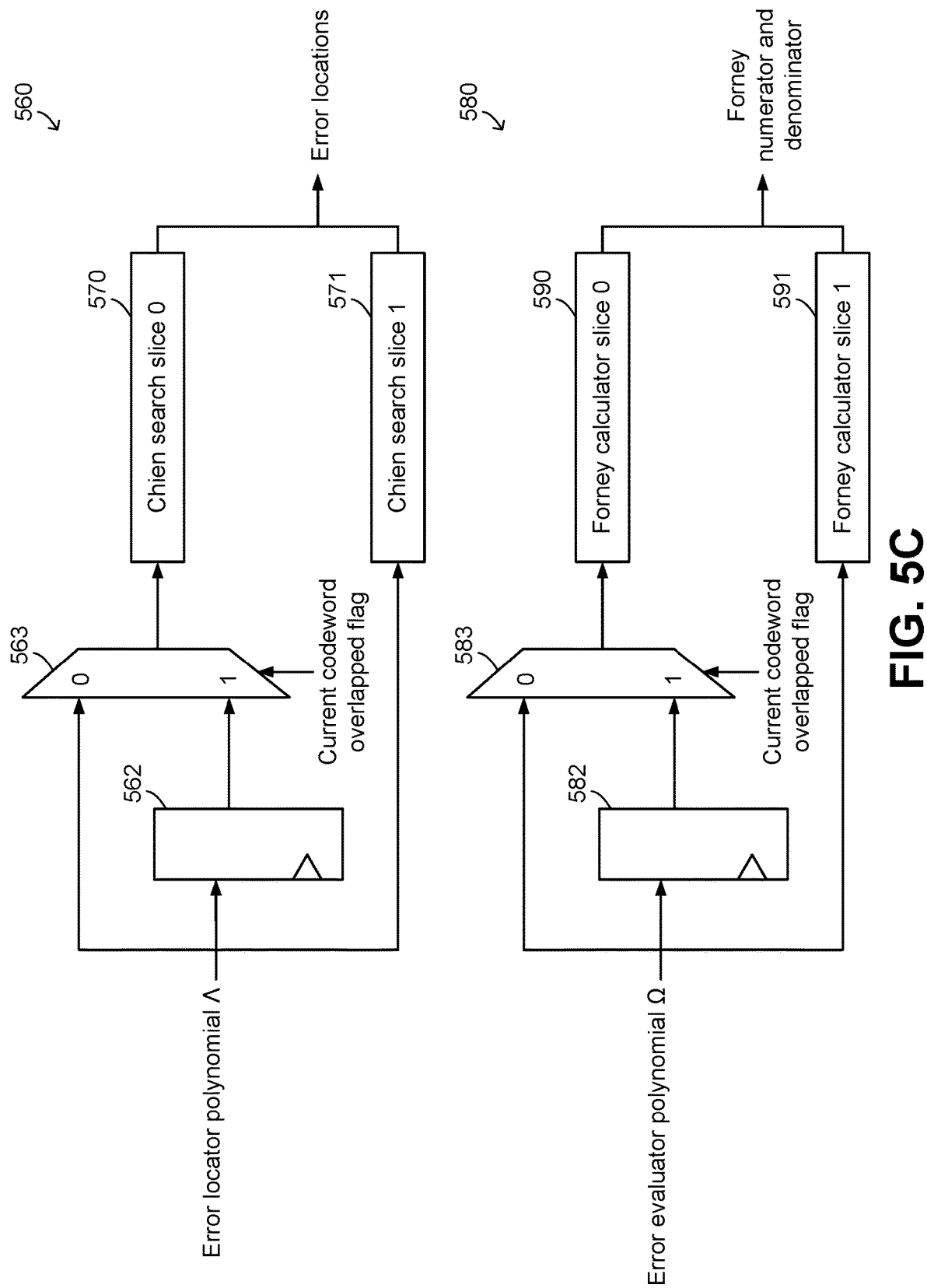
FIG. 5C depicts an example of the present disclosure in which separate circuits are used for performing an error location calculation based on an error locator polynomial A and an error value calculation based on an error evaluator polynomial $\Omega$.

Briefly, as shown in FIG. 5C, an error location calculator circuit 560 includes a first Chien search circuit slice 570 (slice 0) and a second Chien search circuit slice 571 (slice 1) that evaluate an input error locator polynomial Λ at various positions, where a register 562 stores the error locator polynomial Λ and delays supplying the error locator polynomial Λ to the first Chien search circuit slice 570 (slice 0) using a multiplexer 563 controlled based on the current codeword overlapped flag (e.g., indicating whether the current codeword is an overlapped or odd codeword 552).

Likewise, as shown in FIG. 5C, an error evaluation calculator circuit 580 includes a first Forney calculator circuit slice 590 (slice 0) and a second Forney calculator circuit slice 591 (slice 1) that evaluate an input error evaluator polynomial Ω at various positions, where a register 582 stores the error evaluator polynomial Ω and delays supplying the error evaluator polynomial Ω to the first Forney calculator circuit slice 570 (slice 0) using a multiplexer 583 controlled based on the current codeword overlapped flag.

Referring back to FIG. 1, an error counter and error evaluator circuit 170 receives the error locations and Forney numerator and denominator from the error location and error value calculator circuit 150 and calculates an error count from the error locations and determines the error magnitude from the Forney numerator and denominator.

Figure 6A:
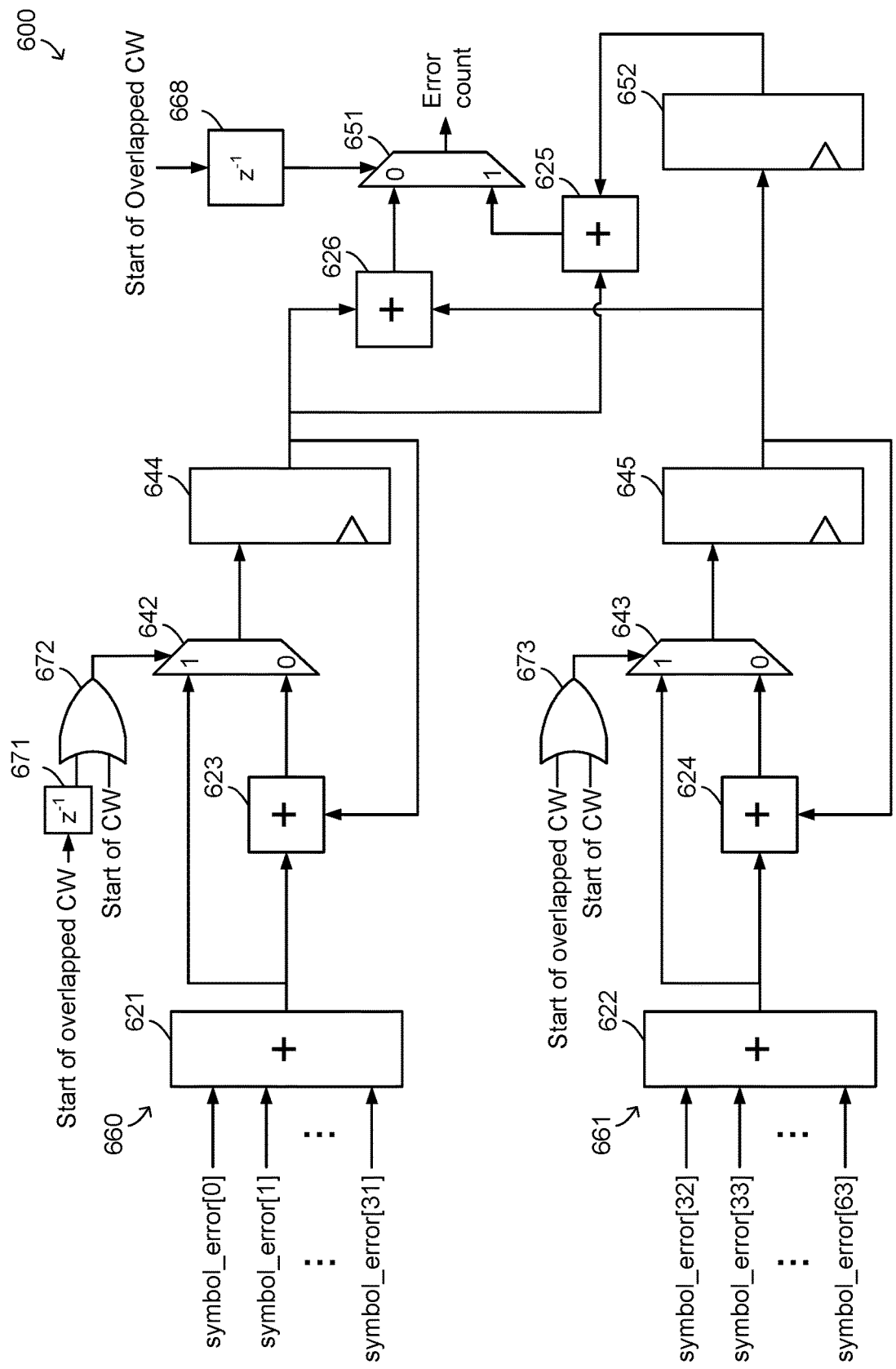
FIG. 6A is a block diagram depicting an error count calculator according to one example of the present disclosure.
Figure 6B:
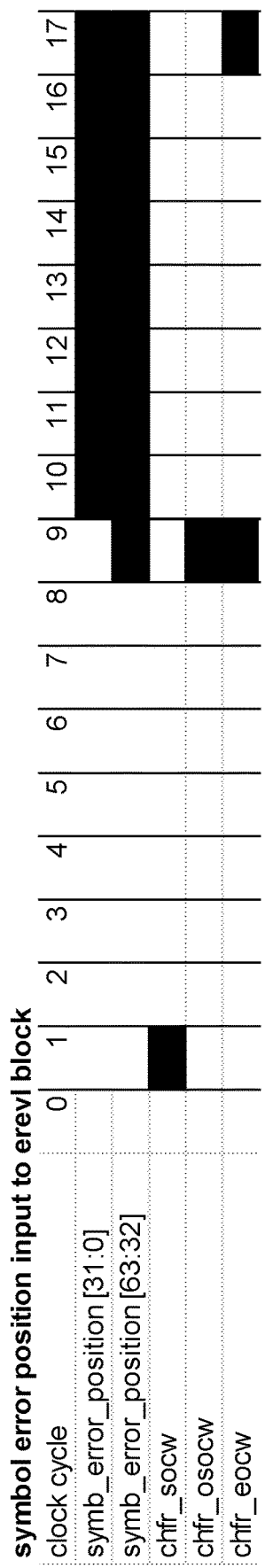
FIG. 6B is a timing diagram depicting the processing of symbol error positions by a first circuit slice (slice 0) and a second circuit slice (slice 1) operating on different portions of an input interface of an error count calculator, where input symbol error positions for two different codewords overlap during an overlap clock cycle.

FIG. 6A is a block diagram depicting an error count calculator circuit 600 according to one example of the present disclosure. The error count calculator 600 may be included as a component of an error counter and error evaluator circuit 170 of a Reed-Solomon decoder circuit 100 of the present disclosure. FIG. 6B is a timing diagram depicting the processing of symbol error positions by a first circuit slice (slice 0) and a second circuit slice (slice 1) operating on different portions of an input interface of an error count calculator, where input symbol error positions for two different codewords overlap during an overlap clock cycle. As noted above, the processing is delayed by one clock cycle because, as discussed above with respect to FIG. 5A, slice 0 of the Chien-Forney calculator cannot begin processing the next polynomial evaluation until the previous polynomial evaluation is complete.

The error count calculator 600 computes a total error count based on the error locations computed by the error evaluator based on the error locator polynomial. In particular, the error count is the number of error locations (number of values $a^{-k}$ for which error locator polynomial evaluated to zero), and therefore can be computed by adding the values of symbol_error across all of the positions of the codeword. In a manner similar to that described above for a syndrome calculator 300 shown in FIG. 3 according to one example of the present disclosure, the error count calculator 600 includes a first circuit slice (slice 0) 660 and a second circuit slice (slice 1) 661 that may be configured to process two different codewords in parallel or may be combined to perform processing on multiple codewords that overlap during a clock cycle, e.g., where half of the symbol_error values during an overlap clock cycle correspond to a first, non-overlapped or even codeword and the other half of the codewords correspond to a second, overlapped or odd codeword.

Each circuit slice of the error count calculator circuit 600 shown in FIG. 6A operates on 32 inputs—the first circuit slice (slice 0) 660 operates on symbol_error[0] through symbol_error[31], and the second circuit slice (slice 1) 661 operates on symbol_error[32] through symbol_error[63].

The first circuit slice (slice 0) 660 uses a first adder 621 to add the supplied error locations (e.g., 1 indicating an error and 0 indicating no error) symbol_error[0] to symbol_error[31] to count the number of errors in positions 0 through 31 of the interface width of 64 error locations. Likewise, the second circuit slice (slice 1) 661 uses a second adder 622 to add the supplied error locations symbol_error[32] to symbol_error[63] to count the number of errors in positions 32 through 63.

In a manner similar to that of the syndrome calculator 300, in the first cycle of a non-overlapped codeword (or even codeword), where the error locations (symbol_error) of the first 64 locations of the codeword are supplied as input to the error count calculator circuit 600, a first error count register 644 and a second error count register 645 are initialized with the respective error count from the first 64 error locations of the non-overlapped codeword, as controlled by the start of CW signal supplied to first multiplexer 642 and second multiplexer 643. In more detail, in the example shown in FIG. 6A, the first multiplexer 642 is controlled by the start of codeword signal or by the start of overlapped codeword signal (as delayed by delay line 671) and as determined by a first OR gate 672. Likewise, the second multiplexer 643 is controlled by the start of overlapped codeword signal or the start of codeword signal, as determined by a second OR gate 673.

In successive clock cycles, the sum computed by the first adder 621 is added to a first accumulated count of errors seen by the first circuit slice (slice 0) stored in the first error count register 644 by a third adder 623, and the sum computed by the second adder 622 is added to a second accumulated count of errors seen by the second circuit slice (slice 1) stored in the second error count register 645 by a fourth adder 624. These new accumulated counts of errors are stored into the first error count register 644 and the second error count register 645.

Referring to FIG. 6B, after the clock cycle in which the start of overlapped CW signal is high, all of the error locations for the non-overlapped codeword have been input into the error count calculator circuit 600. However, during this clock cycle (the ninth clock cycle), the second circuit slice 600 also receives error locations corresponding to an overlapped codeword. As such, a third error count register (or error count overlap register) 652 saves the second accumulated count of errors from the non-overlapped codeword and fifth adder 625 adds this second accumulated count of errors from the second circuit slice (slice 1) 661 to the first accumulated count of errors from the first circuit slice (slice 0) 660 (stored in the first error count register 644).

As such, the total error count for the non-overlapped codeword is determined in the $10^{th}$ cycle as:

error_count=(error_counter_reg_slice0+error_counter_overlap_reg)

On the other hand, when computing the error count for an overlapped codeword (or odd codeword), the first circuit slice (slice 0) and the second circuit slice (slice 1) both finish computing the error count for the overlapped codeword during the same cycle (e.g., the $17^{th}$ clock cycle, as shown in FIG. 6B), and therefore a sixth adder 626 can merely add the accumulated error counts from the first error count register 644 and the second error count register 645. An output multiplexer 651 selects between the output of the fifth adder 625 and the sixth adder 626 based on whether the current cycle is the cycle after the start of overlapped CW signal, as controlled by the delay 668. As such, the total error count for overlapped codeword (determined in the $18^{th}$ cycle) is:

error_count=(error_counter_reg_slice0+error_counter_reg_slice1)

Accordingly, assuming the codewords alternate between non-overlapped and overlapped codewords (even and odd codewords), the error count calculator circuit 600 computes error counts for the two codewords every 17 cycles. which matches the throughput of the other portions of the Reed-Solomon decoder according to the present disclosure.

Figure 7B:
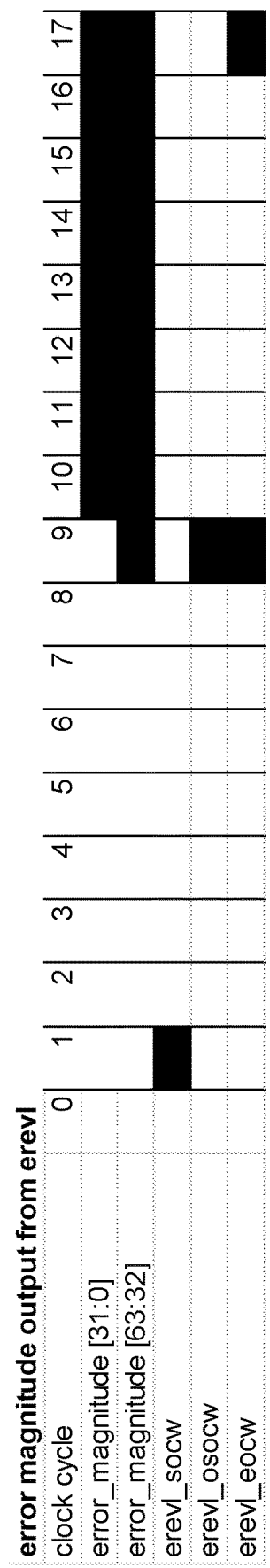
FIG. 7B is a timing diagram depicting the processing of Forney numerator and denominator values by a first circuit slice (slice 0) and a second circuit slice (slice 1) operating on different portions of an input interface of an error value calculator, where input Forney numerator and denominator values for two different codewords overlap during an overlap clock cycle.

FIG. 7A is a block diagram depicting an error magnitude calculator 700 of an error evaluator according to one example of the present disclosure. The error magnitude calculator 700 may be included as a component of an error counter and error evaluator circuit 170 of a Reed-Solomon decoder circuit 100 of the present disclosure. FIG. 7B is a timing diagram depicting the processing of Forney numerator and denominator values by a first circuit slice (slice 0) and a second circuit slice (slice 1) operating on different portions of an input interface of an error value calculator, where input Forney numerator and denominator values for two different codewords overlap during an overlap clock cycle.

The error magnitude is calculated at each position of the codeword in accordance with:

error_magnitude[$i$]=numerator[$i$]/denominator[$i$] for $0<=i<IFW$

Accordingly, FIG. 7A shows an error magnitude calculator that includes GF dividers 710 arranged into a first circuit slice (slice 0) 760 and a second circuit slice (slice 1) 761. In the arrangement shown in FIG. 7A, the first circuit slice (slice 0) 760 includes IFW/2 GF dividers 710 (e.g., 32 GF dividers corresponding to positions 0 through 31 of a Reed-Solomon decoder with an interface width of 64 symbols) and the second circuit slice (slice 1) 761 also includes IFW/2 GF dividers (e.g., 32 GF dividers corresponding to positions 32 through 63 of the full interface width of 64 symbols). Each divider takes the Forney numerator and the Forney denominator (computed by the error location and error value calculator circuit 150 such as the Chien-Forney circuit slices shown in FIG. 5A or the Forney calculators shown in FIG. 5C) associated with each position and computes a corresponding error magnitude (error_magnitude) based on the GF quotient of the Forney numerator and the Forney denominator.

Referring to FIG. 7B, the error magnitudes output by the error magnitude calculator 700 reflect the overlap of codewords. For every alternate codeword, during the overlap clock cycle, the upper 32 symbols of error magnitude (e.g., positions 32 to 63 of the interface width, as supplied to in slice 1) correspond to overlapped codeword and lower 32 symbols (e.g., positions 0 to 31 of the interface width, as supplied to slice 0) correspond to non-overlapped codeword.

In addition, in some examples of the present disclosure, the error magnitude calculator (or error evaluator or erevl) also generates start of codeword (socw), start of overlapped codeword (osocw), and end of codeword (eocw) markers or signals to reflect start, overlapped start and end of the current codeword. These additional signals are provided to, for example, the error corrector circuit 190.

Referring back to FIG. 1, the error count and the error magnitudes computed by the error counter and error evaluator circuit 170 are provided to an error corrector circuit 190. In some embodiments, the error corrector circuit 190 compares the error count to the value T and proceeds with correcting the error when the error count is less than or equal to T. If the error count is greater than T, then the error corrector circuit 190 generates a signal that the received codeword contains an uncorrectable number of errors.

In a case where the number of errors is correctable, the error magnitudes computed by the error evaluator circuit 170 or error magnitude calculator (e.g., the error magnitude calculator 700) are added to the corresponding RS decoder input data at the positions of the errors to compute the output data 104. To account for the latency between supplying input codewords to the Reed-Solomon decoder 100 and the computation of the error magnitudes through the pipeline of operations performed by the Reed-Solomon decoder 100, the RS decoder input data (e.g., the input codewords) that were initially supplied to the Reed-Solomon decoder 100 are buffered or cached in a memory 180 until the error magnitudes for the corresponding input codewords have been computed by the error evaluator circuit 170. Accordingly, the memory 180 buffers the RS decoder input data in order to temporally align the RS decoder input data with the error magnitude values computed based on the RS decoder input data. The corresponding RS decoder input data is read from the memory 180 and supplied to the error corrector 190 in temporal alignment with the corresponding error magnitude values.

FIG. 8 is a block diagram depicting an error corrector circuit 800 according to one example of the present disclosure. As shown in FIG. 8, a plurality of GF adders 810 (e.g., a number of GF adders equal to the interface width of the Reed-Solomon decoder) are arranged to add the error magnitudes computed by the error count and error evaluator circuit 170 (e.g., the error magnitude calculator 700 or error evaluator) and to GF add the error magnitudes (Error_magnitude) to the values at corresponding locations of the received codeword (e.g., Received_codeword) to compute a corrected codeword (Corrected_codeword):

Corrected_codeword[$i$]=Received_codeword[$i$]+Error_magnitude[$i$]

for $0\leq i\leq 544$.

In some circumstances, the 2T parity symbols are omitted from the calculation, such that only the K message symbols (e.g., 514 message symbols) are GF added to the corresponding error magnitudes:

Corrected_codeword[$i$]=Received_codeword[$i$]+Error_magnitude[$i$]

for $0\leq i\leq 514$.

Figure 10:
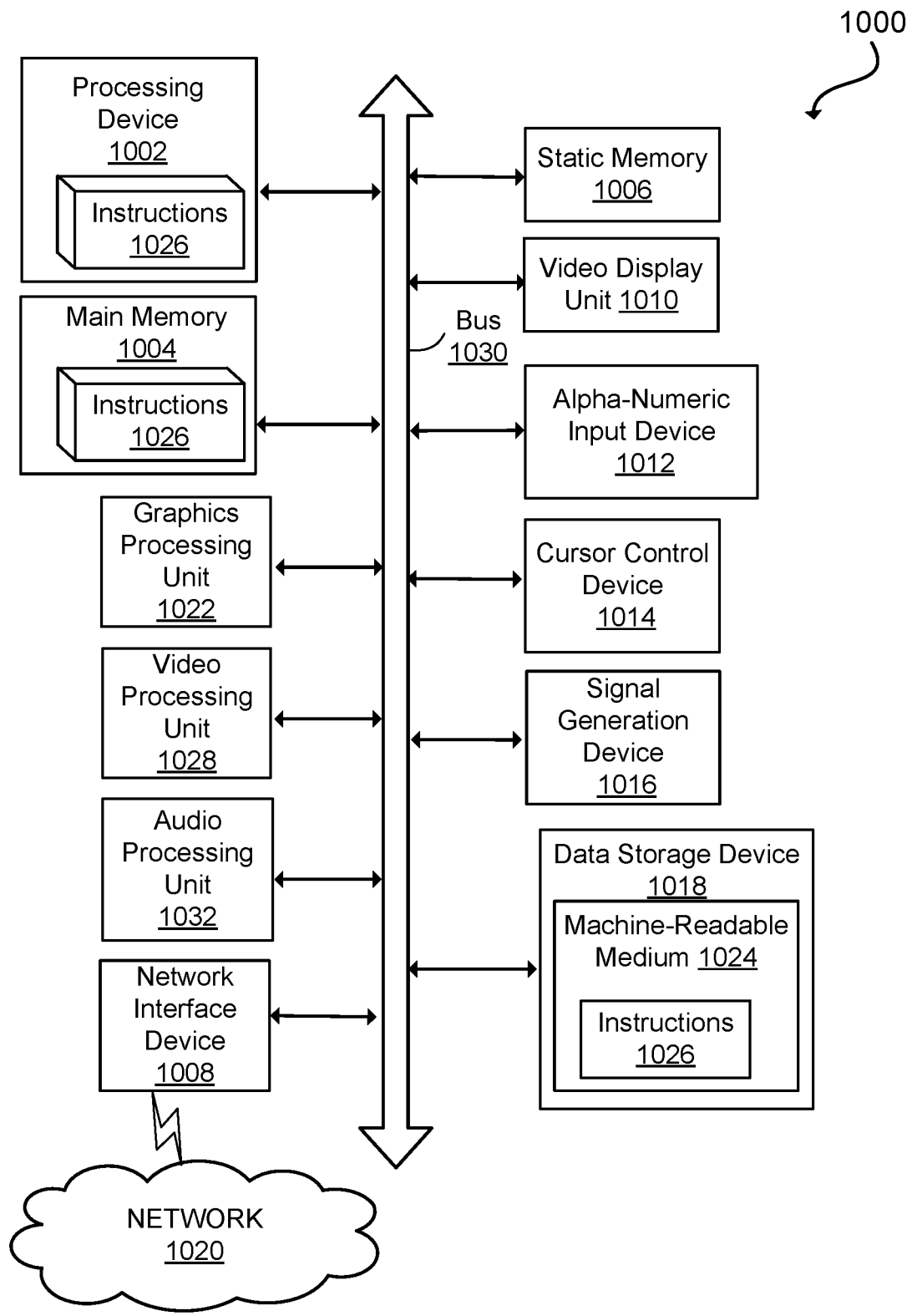
FIG. 10 depicts a diagram of an example computer system in which embodiments of the present disclosure may operate.

The computed corrected codeword is then written out as the Reed-Solomon decoder output data 104 (e.g., including K decoded message symbols and, in some cases, 2T decoded parity symbols), which may be stored in an external memory (e.g., dynamic random access memory or DRAM) for later use. For example, a Reed-Solomon decoder circuit 100 according to the present disclosure may be included in a computer system 1000, as shown in FIG. 10, such as by being integrated into a network interface device 1008 for performing Reed-Solomon decoding of data packets received from a network 1020. The decoded data packets may be stored or buffered in a memory of the network interface device 1008 before transmitted over a bus 1030 to a main memory 1004 of the computer system 1000, where the data stored in the main memory 1004 may then be provided to software applications running on the computer system 1000.

Figure 9:
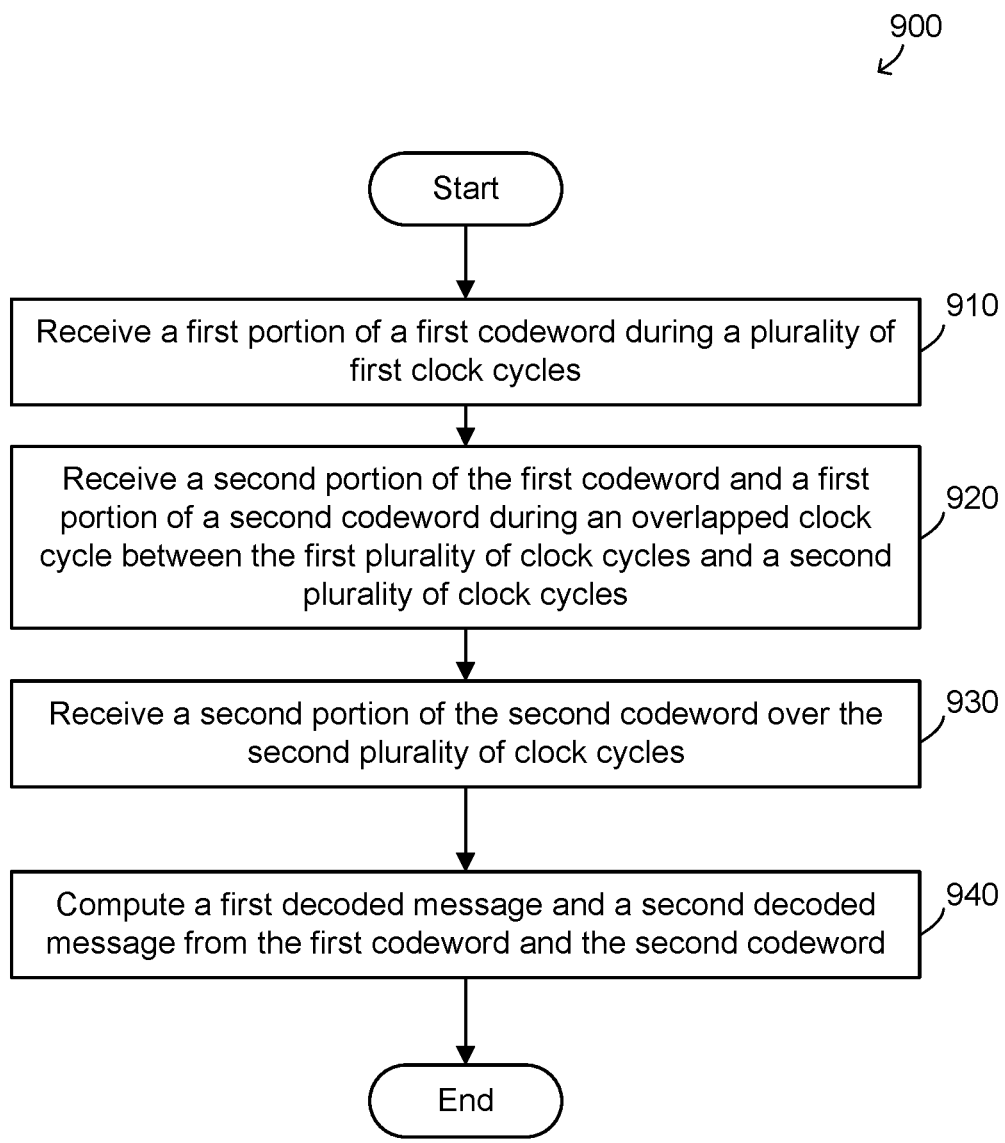
FIG. 9 is a flowchart of a method for computing syndrome values during an overlap clock cycle according to one example of the present disclosure.

FIG. 9 is a flowchart of a method 900 for computing syndrome values during an overlap clock cycle according to one example of the present disclosure. At 910, a Reed-Solomon decoder circuit receives a first portion of a first codeword (e.g., symbols $X_{543}$ through $X_{32}$) during a plurality of first clock cycles (e.g., clock cycles 0 through 7 as shown in FIG. 2B). At 920, the Reed-Solomon decoder circuit receives a second portion of the first codeword (e.g., symbols $X_{31}$ through $X_0$) and a first portion (e.g., symbols $X_{543}$ through $X_{512}$) of a second codeword during an overlap clock cycle (e.g., clock cycle 8 as shown in FIG. 2B) between the first plurality of clock cycles and a second plurality of clock cycles (e.g., clock cycles 9 through 16 as shown in FIG. 2B). At 930, the Reed-Solomon decoder circuit receives a second portion (e.g., symbols $X_{511}$ through $X_0$) of the second codeword over the second plurality of clock cycles (e.g., clock cycles 9 through 16 as shown in FIG. 2B).

At 940, the Reed-Solomon decoder circuit computes a first decoded message and a second decoded message from the first codeword and the second codeword, the first decoded message and the second decoded message being output during a period having a length equal to the sum of the first plurality of clock cycles, the overlap clock cycle, and the second plurality of clock cycles. In other words, the Reed-Solomon decoder circuit computes messages from the input codewords at a throughput matching the rate at which codewords are supplied to the Reed-Solomon decoder circuit. The Reed-Solomon decoder circuit in various examples of the present disclosure performs the computation using the sequence or pipeline shown in FIG. 1, such as through the use of the syndrome calculator circuit 110, the error locator and error evaluator polynomial calculator circuit 130, the error location and error value calculator circuit 150, the error counter and error evaluator circuit 170, and the error corrector circuit 190.

The table below compares two different implementations of Reed-Solomon decoders configured to decode codewords in RS(544,514) coding with symbols in $GF(2^{10})$ (10 bit symbols). A comparative baseline implementation does not perform overlapped processing according to the present disclosure and therefore runs at a higher clock frequency in order to meet the throughput requirements of the communications system in which the Reed-Solomon decoder operates (e.g., a network interface device 1008). An implementation according to the present disclosure uses overlapped processing as discussed above, and therefore operates at a lower clock frequency (e.g., the same clock frequency as other portions of the communications system), but uses approximately 4% more area (e.g., the area of an integrated circuit that includes a Reed-Solomon decoder according to the present disclosure is 4% larger than the comparative baseline implementation).

| Config | Mode | Overlapped Processing | Parallelism symbols per clock | Clock frequency GHz | Area |
|---|---|---|---|---|---|
| DEC-2Port | RS(544,514) | Yes | 64 | 1.33 | 1.04 |
| DEC-2Port | RS(544,514) | No | 64 | 1.408 | 1.00 |

As such, a Reed-Solomon architecture according to the present disclosure provides the same throughput as a comparative Reed-Solomon decoder architecture while working at a lower clock speed. Without overlapped processing of codewords, the comparative Reed-Solomon decoder must operate at faster clock (e.g., 1.408 GHz) to meet throughput requirements, which presents challenges in terms of timing closure and power consumption and the need for a new clock source and associated backend challenges.

A Reed-Solomon decoder according to the present disclosure may be implemented in hardware, such as by fabricating an integrated circuit to implement a Reed-Solomon decoder as described above through the placement and connection of standard cells, where these standard cells implement components of a Reed-Solomon decoder such as Galois Field (GF) adders, GF multipliers, GF dividers, registers, and logic gates and based on these placed and connected standard cells. The Reed-Solomon decoder may be described in a high-level language or hardware description language ("HDL") such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. The description of the Reed-Solomon decoder can be compiled into a lower level description (e.g., mask-level description) and the lower level description can be supplied to a fabrication system to fabricate a hardware circuit that physically implements the Reed-Solomon decoder.

In some circumstances, a Reed-Solomon decoder is implemented by configuring a field programmable gate array (FPGA) to perform the functions described herein. The Reed-Solomon decoder may be represented in a bit file that is used to program or configure the FPGA to perform the functions described herein, where the bit file may similarly be generated by compiling a description of the Reed-Solomon decoder in an HDL.

As such, a Reed-Solomon decoder according to the present disclosure can be represented as data stored in non-transitory computer readable media, where this representation specifies the design of a hardware circuit that physically implements the Reed-Solomon decoder. As noted above, the computer-readable representation of the Reed-Solomon decoder includes, but is not limited to, a hardware description language-level description, a register transfer level description, a gate-level description, a layout-level description, a mask-level description, a bit file for programming an FPGA, and the like. The hardware circuit that physically implements the Reed-Solomon decoder based on these computer-readable representations may also include other circuits configured to perform other functions. For example, a network interface device may include an integrated circuit having an analog front-end that is configured to convert analog waveforms into digital data, where the digital data is supplied to the Reed-Solomon decoder implemented in the same integrated circuit as the analog front-end. The same integrated circuit may also include memory (e.g., static memory) for buffering decoded data before transferring the data to main memory over the bus.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

As noted above, the network interface device 1008 may incorporate a Reed-Solomon decoder according to the present disclosure. However, the disclosure is not limited thereto, and a Reed-Solomon decoder according to the present disclosure may also be incorporated into other hardware of the computer system 1000 that perform Reed-Solomon decoding.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
    receiving a first portion of a first codeword during a plurality of first non-overlap clock cycles;
    receiving, by a Reed-Solomon decoder circuit, a second portion of the first codeword and a first portion of a second codeword during an overlap clock cycle between the first plurality of non-overlap clock cycles and a second plurality of non-overlap clock cycles;
    receiving a second portion of the second codeword over the second plurality of non-overlap clock cycles; and
    computing, by the Reed-Solomon decoder circuit, a first decoded message and a second decoded message from the first codeword and the second codeword, the first decoded message and the second decoded message being output during a period having a length equal to a sum of the first plurality of non-overlap clock cycles, the overlap clock cycle, and the second plurality of non-overlap clock cycles.

2. The method of claim 1, wherein the Reed-Solomon decoder circuit comprises a syndrome calculator comprising a first circuit slice and a second circuit slice,
    wherein the first circuit slice comprises a first internal syndrome register configured to store a first accumulated syndrome value computed by the first circuit slice during the first plurality of non-overlap clock cycles based on the first portion of the first codeword,
    wherein the second circuit slice comprises:
        a second internal syndrome register configured to store a second accumulated syndrome value computed by the second circuit slice during the first plurality of non-overlap clock cycles based on the first portion of the first codeword; and
        a third internal syndrome register configured to store a scaled second accumulated syndrome value during the overlap clock cycle,
    wherein the method further comprises computing a syndrome value corresponding to the first codeword during a clock cycle following the overlap clock cycle based on a Galois Field sum of the first accumulated syndrome value stored in the first internal syndrome register and the scaled second accumulated syndrome value stored in the third internal syndrome register.

3. The method of claim 1, wherein the Reed-Solomon decoder circuit comprises an error locator and error evaluator polynomial calculator comprising:
    a plurality of Reformulated Inversion-less Berlekamp Massey (RiBM) instances;
    a demultiplexer connected to a plurality of inputs of corresponding ones of the RiBM instances; and
    a multiplexer connected to a plurality of outputs of corresponding ones of the RiBM instances.

4. The method of claim 3, further comprising:
    routing, by the demultiplexer, a first syndrome value corresponding to the first codeword to a first RiBM instance of the RiBM instances;
    routing, by the demultiplexer, a second syndrome value corresponding to the second codeword to a second RiBM instance of the RiBM instances;
    routing, by the multiplexer, a first error locator polynomial and a first error evaluator polynomial corresponding to the first codeword from the first RiBM instance to an output of the error locator and error evaluator polynomial calculator; and
    routing, by the multiplexer, a second error locator polynomial and a second error evaluator polynomial corresponding to the second codeword from the second RiBM instance to the output of the error locator and error evaluator polynomial calculator.

5. The method of claim 1, wherein the Reed-Solomon decoder circuit comprises an error location and error value calculator circuit comprising:
    a first circuit slice and a second circuit slice configured to compute error locations based on an input error locator polynomial,
    wherein the method comprises delaying supplying the input error locator polynomial to the first circuit slice when the input error locator polynomial corresponds to the second codeword wherein first symbols of the second codeword were supplied to the Reed-Solomon decoder circuit during the overlap clock cycle.

6. The method of claim 1, wherein the Reed-Solomon decoder circuit comprises an error location and error value calculator circuit comprising:
    a first circuit slice and a second circuit slice configured to compute Forney numerator and denominator values based on an input error evaluator polynomial,
    wherein the method comprises:
        delaying supplying the input error evaluator polynomial to the first circuit slice when the input error evaluator polynomial corresponds to the second codeword wherein first symbols of the second codeword were supplied to the Reed-Solomon decoder circuit during the overlap clock cycle.

7. The method of claim 1, wherein the Reed-Solomon decoder circuit comprises an error counter and error evaluator circuit comprising a first circuit slice and a second circuit slice,
    wherein the first circuit slice comprises a first error count register configured to store a first accumulated count of errors computed by the first circuit slice during the first plurality of non-overlap clock cycles based on the first portion of the first codeword,
wherein the second circuit slice comprises:
a second error count register configured to store a second accumulated count of errors computed by the second circuit slice during the first plurality of non-overlap clock cycles based on the first portion of the first codeword; and
a third error count register configured to store the second accumulated count of errors during the overlap clock cycle,
wherein the method further comprises computing a total error count corresponding to the first codeword during a clock cycle following the overlap clock cycle based on a sum of the first accumulated count of errors stored in the first error count register and the second accumulated count of errors stored in the third error count register.

8. A decoder circuit configured to:
receive a first portion of a first codeword during a plurality of first non-overlap clock cycles;
receive a second portion of the first codeword and a first portion of a second codeword during an overlap clock cycle between the first plurality of non-overlap clock cycles and a second plurality of non-overlap clock cycles;
receive a second portion of the second codeword over the second plurality of non-overlap clock cycles; and
compute a first decoded message and a second decoded message from the first codeword and the second codeword, the first decoded message and the second decoded message being output during a period having a length equal to a sum of the first plurality of non-overlap clock cycles, the overlap clock cycle, and the second plurality of non-overlap clock cycles.

9. The decoder circuit of claim 8, wherein the decoder circuit comprises a syndrome calculator comprising a first circuit slice and a second circuit slice,
wherein the first circuit slice comprises a first internal syndrome register configured to store a first accumulated syndrome value computed by the first circuit slice during the first plurality of non-overlap clock cycles based on the first portion of the first codeword,
wherein the second circuit slice comprises:
a second internal syndrome register configured to store a second accumulated syndrome value computed by the second circuit slice during the first plurality of non-overlap clock cycles based on the first portion of the first codeword; and
a third internal syndrome register configured to store a scaled second accumulated syndrome value during the overlap clock cycle,
wherein the decoder circuit is further configured to compute a syndrome value corresponding to the first codeword during a clock cycle following the overlap clock cycle based on a Galois Field sum of the first accumulated syndrome value stored in the first internal syndrome register and the scaled second accumulated syndrome value stored in the third internal syndrome register.

10. The decoder circuit of claim 8, wherein the decoder circuit comprises an error locator and error evaluator polynomial calculator comprising:
a plurality of Reformulated Inversion-less Berlekamp Massey (RiBM) instances;
a demultiplexer connected to a plurality of inputs of corresponding ones of the RiBM instances; and
a multiplexer connected to a plurality of outputs of corresponding ones of the RiBM instances, and
wherein the decoder circuit is further configured to:
route, by the demultiplexer, a first syndrome value corresponding to the first codeword to a first RiBM instance of the RiBM instances;
route, by the demultiplexer, a second syndrome value corresponding to the second codeword to a second RiBM instance of the RiBM instances;
route, by the multiplexer, a first error locator polynomial and a first error evaluator polynomial corresponding to the first codeword from the first RiBM instance to an output of the error locator and error evaluator polynomial calculator; and
route, by the multiplexer, a second error locator polynomial and a second error evaluator polynomial corresponding to the second codeword from the second RiBM instance to the output of the error locator and error evaluator polynomial calculator.

11. The decoder circuit of claim 8, wherein the decoder circuit comprises an error location and error value calculator circuit comprising a first circuit slice and a second circuit slice configured to compute error locations based on an input error locator polynomial,
wherein the decoder circuit is further configured to:
delay supplying the input error locator polynomial to the first circuit slice when the input error locator polynomial corresponds to the second codeword wherein first symbols of the second codeword were supplied to the decoder circuit during the overlap clock cycle.

12. The decoder circuit of claim 8, wherein the decoder circuit comprises an error location and error value calculator circuit comprising a first circuit slice and a second circuit slice configured to compute Forney numerator and denominator values based on an input error evaluator polynomial,
wherein the decoder circuit is further configured to:
delaying supplying the input error evaluator polynomial to the first circuit slice when the input error evaluator polynomial corresponds to the second codeword wherein first symbols of the second codeword were supplied to the decoder circuit during the overlap clock cycle.

13. The decoder circuit of claim 8, wherein the decoder circuit comprises an error counter and error evaluator circuit comprising a first circuit slice and a second circuit slice,
wherein the first circuit slice comprises a first error count register configured to store a first accumulated count of errors computed by the first circuit slice during the first plurality of non-overlap clock cycles based on the first portion of the first codeword,
wherein the second circuit slice comprises:
a second error count register configured to store a second accumulated count of errors computed by the second circuit slice during the first plurality of non-overlap clock cycles based on the first portion of the first codeword; and
a third error count register configured to store the second accumulated count of errors during the overlap clock cycle,
wherein the decoder circuit is further configured to compute a total error count corresponding to the first codeword during a clock cycle following the overlap clock cycle based on a sum of the first accumulated count of errors stored in the first error count register and the second accumulated count of errors stored in the third error count register.

14. A non-transitory computer-readable medium comprising stored instructions, which when executed by a processor, cause the processor to generate a digital representation of an integrated circuit configured to:
receive a first portion of a first codeword during a plurality of first non-overlap clock cycles;
receive a second portion of the first codeword and a first portion of a second codeword during an overlap clock cycle between the first plurality of non-overlap clock cycles and a second plurality of non-overlap clock cycles;
receive a second portion of the second codeword over the second plurality of non-overlap clock cycles; and
compute a first decoded message and a second decoded message from the first codeword and the second codeword, the first decoded message and the second decoded message being output during a period having a length equal to a sum of the first plurality of non-overlap clock cycles, the overlap clock cycle, and the second plurality of non-overlap clock cycles.

15. The non-transitory computer-readable medium of claim 14, further comprising stored instructions, which when executed by the processor, cause the processor to generate a digital representation of the integrated circuit comprising a syndrome calculator comprising a first circuit slice and a second circuit slice,
wherein the first circuit slice comprises a first internal syndrome register configured to store a first accumulated syndrome value computed by the first circuit slice during the first plurality of non-overlap clock cycles based on the first portion of the first codeword,
wherein the second circuit slice comprises:
a second internal syndrome register configured to store a second accumulated syndrome value computed by the second circuit slice during the first plurality of non-overlap clock cycles based on the first portion of the first codeword; and
a third internal syndrome register configured to store a scaled second accumulated syndrome value during the overlap clock cycle,
wherein the integrated circuit is further configured to compute a syndrome value corresponding to the first codeword during a clock cycle following the overlap clock cycle based on a Galois Field sum of the first accumulated syndrome value stored in the first internal syndrome register and the scaled second accumulated syndrome value stored in the third internal syndrome register.

16. The non-transitory computer-readable medium of claim 14, further comprising stored instructions, which when executed by the processor, cause the processor to generate a digital representation of the integrated circuit comprising an error locator and error evaluator polynomial calculator comprising:
a plurality of Reformulated Inversion-less Berlekamp Massey (RiBM) instances;
a demultiplexer connected to a plurality of inputs of corresponding ones of the RiBM instances; and
a multiplexer connected to a plurality of outputs of corresponding ones of the RiBM instances.

17. The non-transitory computer-readable medium of claim 16, wherein the integrated circuit is further configured to:
route, by the demultiplexer, a first syndrome value corresponding to the first codeword to a first RiBM instance of the RiBM instances;
route, by the demultiplexer, a second syndrome value corresponding to the second codeword to a second RiBM instance of the RiBM instances;
route, by the multiplexer, a first error locator polynomial and a first error evaluator polynomial corresponding to the first codeword from the first RiBM instance to an output of the error locator and error evaluator polynomial calculator; and
route, by the multiplexer, a second error locator polynomial and a second error evaluator polynomial corresponding to the second codeword from the second RiBM instance to the output of the error locator and error evaluator polynomial calculator.

18. The non-transitory computer-readable medium of claim 14, further comprising stored instructions, which when executed by the processor, cause the processor to generate a digital representation of the integrated circuit comprising an error location and error value calculator circuit comprising a first circuit slice and a second circuit slice configured to compute error locations based on an input error locator polynomial
wherein the integrated circuit is further configured to:
delay supplying the input error locator polynomial to the first circuit slice when the input error locator polynomial corresponds to the second codeword wherein first symbols of the second codeword were supplied to the integrated circuit during the overlap clock cycle.

19. The non-transitory computer-readable medium of claim 14, further comprising stored instructions, which when executed by the processor, cause the processor to generate a digital representation of the integrated circuit comprising an error location and error value calculator circuit comprising a first circuit slice and a second circuit slice configured to compute Forney numerator and denominator values based on an input error evaluator polynomial,
wherein the integrated circuit is further configured to:
delaying supplying the input error evaluator polynomial to the first circuit slice when the input error evaluator polynomial corresponds to the second codeword wherein first symbols of the second codeword were supplied to the integrated circuit during the overlap clock cycle.

20. The non-transitory computer-readable medium of claim 14, further comprising stored instructions, which when executed by the processor, cause the processor to generate a digital representation of the integrated circuit comprising an error counter and error evaluator circuit comprising a first circuit slice and a second circuit slice,
wherein the first circuit slice comprises a first error count register configured to store a first accumulated count of errors computed by the first circuit slice during the first plurality of non-overlap clock cycles based on the first portion of the first codeword,
wherein the second circuit slice comprises:
a second error count register configured to store a second accumulated count of errors computed by the second circuit slice during the first plurality of non-overlap clock cycles based on the first portion of the first codeword; and
a third error count register configured to store the second accumulated count of errors during the overlap clock cycle, wherein the integrated circuit is further configured to compute a total error count corresponding to the first codeword during a clock cycle following the overlap clock cycle based on a sum of the first accumulated count of errors stored in the first error count register and the second accumulated count of errors stored in the third error count register.

* * * * *